United States Patent
Kim et al.

(10) Patent No.: US 12,396,183 B2
(45) Date of Patent: Aug. 19, 2025

(54) SEMICONDUCTOR DEVICE

(71) Applicant: SAMSUNG ELECTRONICS CO., LTD., Suwon-si (KR)

(72) Inventors: Hyelee Kim, Seoul (KR); Jongwook Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 430 days.

(21) Appl. No.: 17/672,954

(22) Filed: Feb. 16, 2022

(65) Prior Publication Data
US 2022/0406883 A1 Dec. 22, 2022

(30) Foreign Application Priority Data
Jun. 18, 2021 (KR) .................. 10-2021-0079204

(51) Int. Cl.
| | | |
|---|---|---|
| *H05K 1/16* | (2006.01) | |
| *H01L 23/522* | (2006.01) | |
| *H05K 7/00* | (2006.01) | |
| *H10B 12/00* | (2023.01) | |
| *H10D 1/20* | (2025.01) | |

(52) U.S. Cl.
CPC .......... *H10D 1/20* (2025.01); *H01L 23/5227* (2013.01); *H05K 1/16* (2013.01); *H10B 12/50* (2023.02)

(58) Field of Classification Search
CPC .......... H01L 28/10; H01L 2924/19042; H01L 2924/19107; H01L 2924/30107; H01L 23/5227; H01L 23/5328; H01L 23/5329; H01L 2924/0002; H10B 12/50; G06K 19/07749; G06K 19/07775; G06K 19/07784
See application file for complete search history.

(56) References Cited

U.S. PATENT DOCUMENTS

| | | | |
|---|---|---|---|
| 5,095,357 A | 3/1992 | Andoh et al. | |
| 5,643,804 A * | 7/1997 | Arai ................... | H10D 30/0314 438/795 |
| 6,072,205 A * | 6/2000 | Yamaguchi ............ | H10D 86/85 257/532 |

(Continued)

FOREIGN PATENT DOCUMENTS

| | | |
|---|---|---|
| JP | 2006-059955 A | 3/2006 |
| KR | 10-2010-0097192 A | 9/2010 |
| KR | 1020200011216 A | 2/2020 |

*Primary Examiner* — Mary A Wilczewski
*Assistant Examiner* — Tsz K Chiu
(74) *Attorney, Agent, or Firm* — Muir Patent Law, PLLC

(57) ABSTRACT

A semiconductor device includes a plurality of pads connected to an external device, a memory cell array in which a plurality of memory cells are disposed, a logic circuit configured to control the memory cell array and including a plurality of input/output circuits connected to the plurality of pads, and at least one inductor circuit connected between at least one of the plurality of pads and at least one of the plurality of input/output circuits. The inductor circuit includes an inductor pattern connected between the at least one of the plurality of pads and the at least one of the plurality of input/output circuits, and a variable pattern disposed between at least portions of the inductor pattern. The variable pattern is separated from the inductor pattern, the at least one of the plurality of pads, and the at least one of the plurality of input/output circuits.

20 Claims, 29 Drawing Sheets

(56) References Cited

U.S. PATENT DOCUMENTS

| | | | |
|---|---|---|---|
| 6,180,445 B1* | 1/2001 | Tsai | H01L 23/645 |
| | | | 438/238 |
| 6,556,416 B2 | 4/2003 | Kunihiro | |
| 6,661,325 B2* | 12/2003 | Suh | H01F 17/0013 |
| | | | 336/200 |
| 6,761,963 B2* | 7/2004 | Casper | H01L 23/5227 |
| | | | 428/209 |
| 7,268,645 B2* | 9/2007 | Meltzer | H01L 28/10 |
| | | | 333/175 |
| 7,598,838 B2* | 10/2009 | Hargrove | H01F 21/12 |
| | | | 336/200 |
| 7,733,206 B2* | 6/2010 | Park | H01F 21/12 |
| | | | 336/200 |
| 7,796,449 B2* | 9/2010 | Willer | G11C 16/22 |
| | | | 365/189.16 |
| 7,812,689 B2* | 10/2010 | Atsumo | H10D 1/20 |
| | | | 333/139 |
| 8,681,030 B1* | 3/2014 | Huynh | H01L 23/5227 |
| | | | 333/175 |
| 8,716,900 B2 | 5/2014 | Kanno | |
| 8,830,694 B2* | 9/2014 | Kawano | H01L 29/0649 |
| | | | 336/200 |
| 8,872,609 B2 | 10/2014 | Kuroda | |
| 9,716,056 B2* | 7/2017 | Leobandung | H01L 23/481 |
| 9,741,485 B2 | 8/2017 | Sun et al. | |
| 10,396,045 B2* | 8/2019 | Morrow | H01L 28/10 |
| 2002/0005565 A1* | 1/2002 | Forbes | H01F 17/0013 |
| | | | 336/200 |
| 2006/0197642 A1* | 9/2006 | Hargrove | H01L 27/08 |
| | | | 336/200 |
| 2007/0085649 A1* | 4/2007 | Park | H01F 17/0006 |
| | | | 336/200 |
| 2007/0114651 A1* | 5/2007 | Marimuthu | H01L 23/645 |
| | | | 257/690 |
| 2008/0245880 A1* | 10/2008 | Yamazaki | G06K 19/07749 |
| | | | 235/492 |
| 2009/0134949 A1 | 5/2009 | He | |
| 2011/0304012 A1* | 12/2011 | Kim | H01L 27/0805 |
| | | | 257/532 |
| 2013/0140672 A1 | 6/2013 | Sato et al. | |
| 2019/0180931 A1 | 6/2019 | Yoo et al. | |
| 2019/0355508 A1* | 11/2019 | Lim | H01F 17/0013 |
| 2021/0350971 A1* | 11/2021 | Ryu | H01F 41/041 |

\* cited by examiner

SEMICONDUCTOR DEVICE

CROSS-REFERENCE TO RELATED APPLICATION

This application claims the benefit under 35 USC 119(a) of Korean Patent Application No. 10-2021-0079204, filed on Jun. 18, 2021, in the Korean Intellectual Property Office, the entire disclosure of which is incorporated herein by reference for all purposes.

BACKGROUND

1. Field

Embodiments relate to a semiconductor device.

2. Description of the Related Art

Semiconductor devices include pads connected to other external devices, and the pads may be connected to an input/output circuit included in the semiconductor device and including at least one of a transmitter and a receiver.

SUMMARY

Embodiments are directed to a semiconductor device, including a plurality of pads connected to an external device; a memory cell array in which a plurality of memory cells are disposed; a logic circuit configured to control the memory cell array and including a plurality of input/output circuits connected to the plurality of pads; and at least one inductor circuit connected between at least one of the plurality of pads and at least one of the plurality of input/output circuits. The inductor circuit includes an inductor pattern connected between the at least one of the plurality of pads and the at least one of the plurality of input/output circuits, and a variable pattern disposed between at least portions of the inductor pattern. The variable pattern is separated from the inductor pattern, the at least one of the plurality of pads, and the at least one of the plurality of input/output circuits.

Embodiments are directed to a semiconductor device, including a semiconductor substrate; a plurality of elements disposed on the semiconductor substrate; and an interconnection region having a plurality of wiring patterns disposed to be connected to the plurality of elements, the plurality of wiring patterns including an inductor pattern connected to one of a plurality of pads and a variable pattern disposed on the same layer as the inductor pattern. The inductor pattern includes a first line and a second line adjacent to both sides of the variable pattern in a first direction, parallel to an upper surface of the semiconductor substrate, and the first line, the second line, and the variable pattern extend in a second direction, intersecting the first direction and parallel to the upper surface of the semiconductor substrate.

Embodiments are directed to a semiconductor device, including a plurality of pads connected to an external device; an input/output circuit connected to the plurality of pads; and at least one inductor circuit connected between at least one of the plurality of pads and the input/output circuit. The inductor circuit includes an inductor pattern connected between the at least one of the plurality of pads and the input/output circuit, and at least one variable pattern separated from the inductor pattern and adjacent to the inductor pattern. The inductor pattern includes a plurality of line patterns, and a first interval between some line patterns adjacent to the variable pattern, among the plurality of line patterns, is greater than a second interval between other portions of the line patterns not adjacent to the variable pattern.

BRIEF DESCRIPTION OF DRAWINGS

Features will become apparent to those of skill in the art by describing in detail example embodiments with reference to the attached drawings in which.

DETAILED DESCRIPTION

Figure 1:
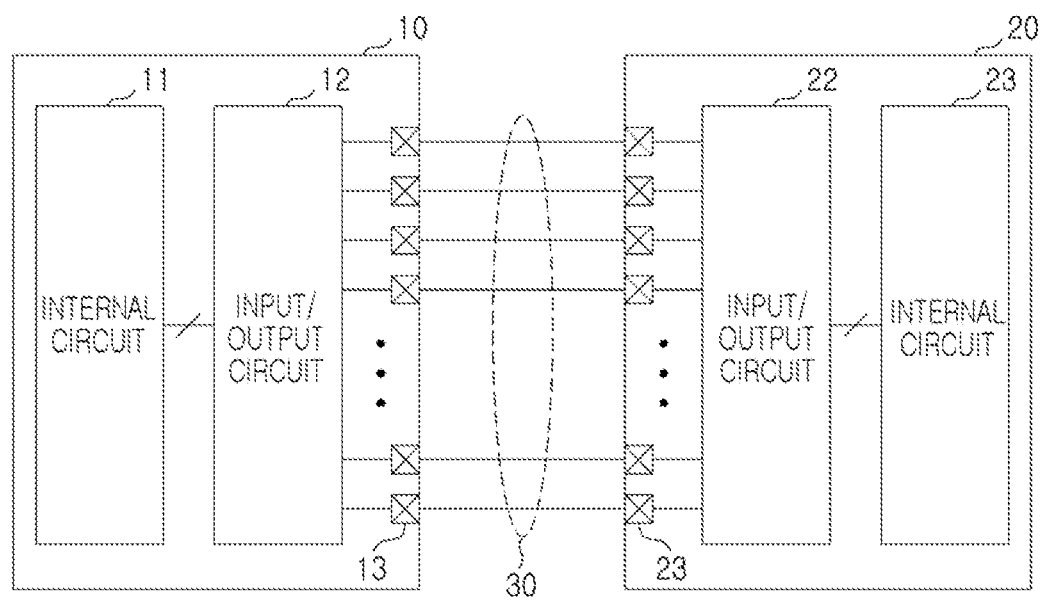
FIG. 1 is a schematic block diagram illustrating a system including a semiconductor device according to an example embodiment.

FIG. 1 is a schematic block diagram illustrating a system including a semiconductor device according to an example embodiment.

Referring to FIG. 1, a system according to an example embodiment may include a first semiconductor device 10 and a second semiconductor device 20, and the first semiconductor device 10 and the second semiconductor device 20 may be connected to be able to communicate with each other.

The first semiconductor device 10 may include an internal circuit 11, an input/output circuit 12, and a plurality of pads 13.

The second semiconductor device 20 may also include an internal circuit 21, an input/output circuit 22, and a plurality of pads 23.

The internal circuit 11 of the first semiconductor device 10 and the internal circuit 21 of the second semiconductor device 20 may have different structures and may perform different functions. For example, the first semiconductor device 10 may be an application processor, and the internal circuit 11 thereof may include a CPU, a GPU, a DSP, an NPU, a memory interface, a display interface, a power circuit, and the like. As another example, the second semiconductor device 20 may be a memory device connected to the application processor, and the internal circuit 21 thereof may include a memory cell array in which memory cells are disposed, and peripheral circuits controlling the memory cell array.

The first semiconductor device 10 and the second semiconductor device 20 may exchange signals through a plurality of transmission lines 30 connecting the pads 13 and 23. For example, the plurality of transmission lines 30 may be provided by wiring patterns formed on a printed circuit board (PCB) on which the first semiconductor device 10 and the second semiconductor device 20 are mounted. In another implementation, the first semiconductor device 10 and the second semiconductor device 20 are stacked on each other, and the plurality of transmission lines 30 may be provided by vertical via structures connecting the first semiconductor device 10 and the second semiconductor device 20 in a stacking direction.

When the first semiconductor device 10 transmits data to the second semiconductor device 20, the data may be modulated into a predetermined signal and then transmitted. In this case, by securing the integrity of the signal for transmitting data, the second semiconductor device 20 may receive and demodulate the signal to accurately restore the data transmitted by the first semiconductor device 10.

When parasitic components exist between the input/output circuit 12 and the plurality of pads 13 as well as in the input/output circuit 12 that modulates data to generate a signal, it may be difficult to secure the integrity of a signal for sending and receiving data.

With respect to the above, in an example embodiment, an inductor circuit may be connected to a signal path between at least one of the plurality of pads 13 and 23 and the input/output circuits 12 and 22. The inductor circuit may include an inductor pattern having a predetermined inductance, and may include a variable pattern disposed between at least portions of the inductor pattern and separated from the inductor pattern. By controlling the total inductance of the inductor circuit by floating a variable pattern included in the inductor circuit or by connecting the variable pattern to a predetermined power voltage, the integrity of a signal exchanged between the semiconductor devices 10 and 20 may be secured and an eye margin may be improved.

FIGS. 2 to 5 are diagrams provided to illustrate an operation of a semiconductor device according to an example embodiment.

Figure 2:
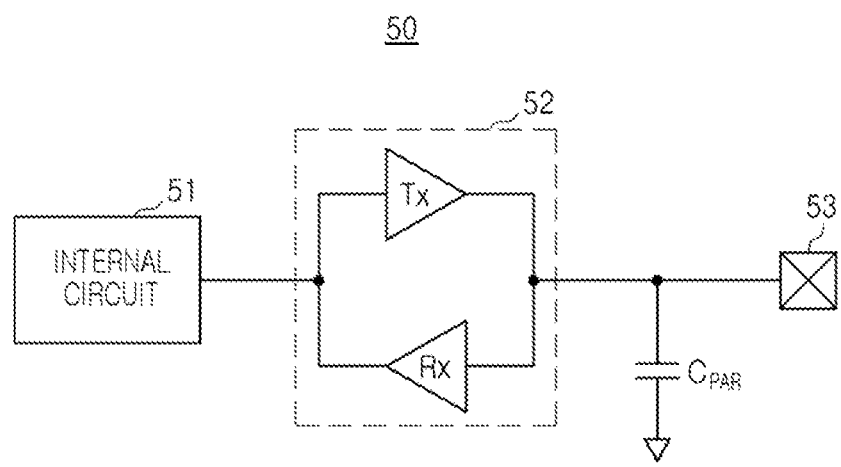
FIGS. 2 to 5 are diagrams provided to illustrate an operation of a semiconductor device according to an example embodiment.
Figure 3:
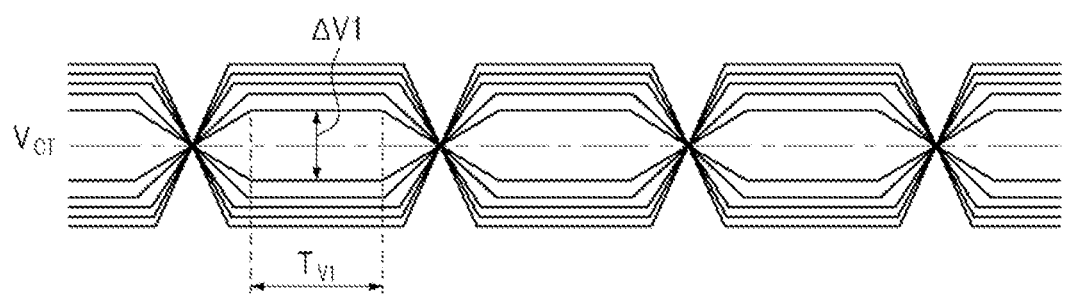

First, FIGS. 2 and 3 are diagrams illustrating a comparative example of a semiconductor device.

Referring to FIG. 2, a semiconductor device 50 according to the comparative example may include an internal circuit 51, an input/output circuit 52, and a pad 53.

The internal circuit 51 may include various circuits according to functions of the semiconductor device 50, and the input/output circuit 52 may include a transmitter Tx and a receiver Rx. An output terminal of the transmitter Tx and an input terminal of the receiver Rx may be connected to the pad 53, and an input terminal of the transmitter Tx and an output terminal of the receiver Rx may be connected to the internal circuit 51.

A parasitic component $C_{PAR}$ may exist in a signal path between the input/output circuit 52 and the pad 53. The signal output from the transmitter Tx to the pad 53 or the signal received by the receiver Rx from the pad 53 may be distorted due to the parasitic component $C_{PAR}$, and as discussed below in connection with FIG. 3, the integrity of the signal may be deteriorated and the eye margin may decrease.

Referring to FIG. 3, a signal that is exchanged between the input/output circuit 52 and the pad 53 may be a signal that swings based on an intermediate voltage $V_{CT}$. For example, when the receiver Rx receives a signal, a first valid period $T_{V1}$ (in which the receiver Rx may restore valid data) may be defined. When a rising edge or a falling edge of a clock signal that determines the operation timing of the receiver Rx exists within the first valid period $T_{V1}$, the receiver Rx may accurately output data. In the comparative example illustrated in FIG. 3, the first valid period $T_{V1}$ of the signal and a swing level $\Delta V1$ of the voltage may decrease due to the parasitic component $C_{PAR}$, and as a result, the eye margin decreases, resulting in deterioration of signal integrity.

Figure 4:
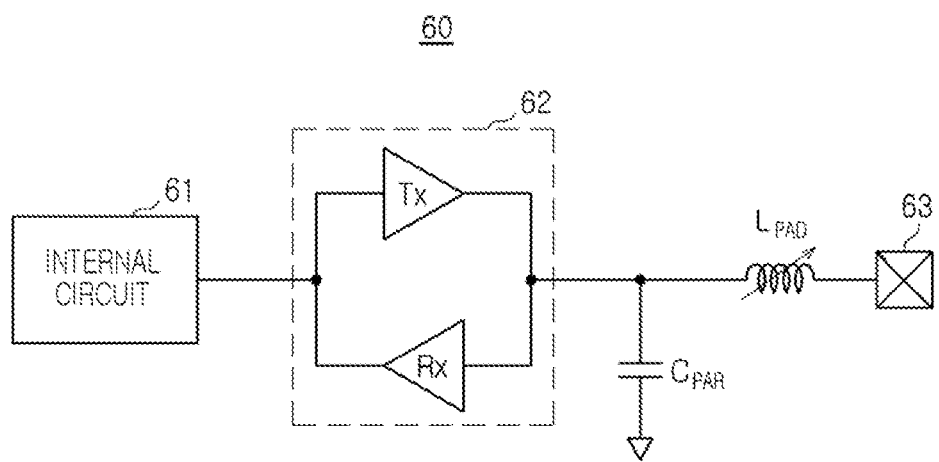

In contrast, referring to FIG. 4, a semiconductor device 60 according to an example embodiment may include an inductor circuit $L_{VAR}$.

Referring to FIG. 4, the inductor circuit $L_{VAR}$ may be connected between an input/output circuit 62 and a pad 63 in series, e.g., one end of the inductor circuit $L_{VAR}$ may be connected to the input/output circuit 62, and the other end may be connected to the pad 63. However, the connection form of the inductor circuit $L_{VAR}$ may be variously modified according to example embodiments.

The inductor circuit $L_{VAR}$ may have an adjustable or variable inductance instead of a fixed inductance. For example, at least a portion of the inductor circuit $L_{VAR}$ may be connected to at least one circuit element included in the internal circuit 61, and the inductance of the inductor circuit $L_{VAR}$ may be adjusted using the circuit element.

The inductance of the inductor circuit $L_{VAR}$ may be set or determined according to the parasitic component $C_{PAR}$ existing between the input/output circuit 62 and the pad 63. The inductance of the inductor circuit $L_{VAR}$ may be combined with the capacitance of the parasitic component $C_{PAR}$, and may be determined as a value that may secure a maximum eye margin of the signal exchanged between the input/output circuit 62 and the pad 63.

Figure 5:
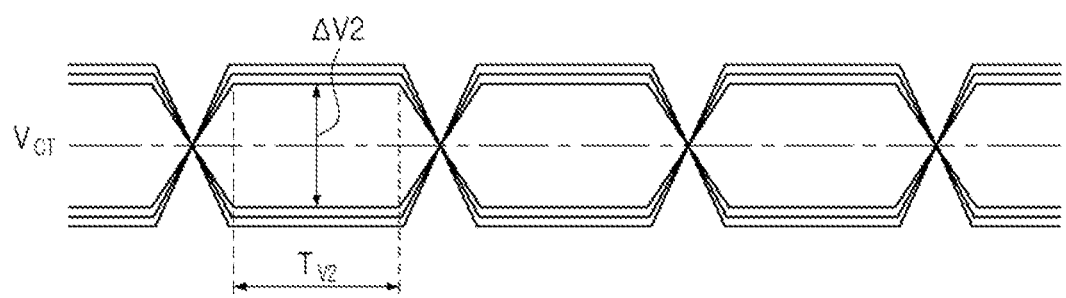

Referring to FIG. 5, by appropriately selecting the inductance of the inductor circuit $L_{VAR}$, the valid period of the signal may be increased from the first valid period $T_{V1}$ illustrated in FIG. 3 to a second valid period $T_{V2}$. In addition, the swing level of the voltage may also be increased to a second swing level $\Delta V2$, which is greater than the first swing level $\Delta V1$ illustrated in FIG. 3.

Figure 6:
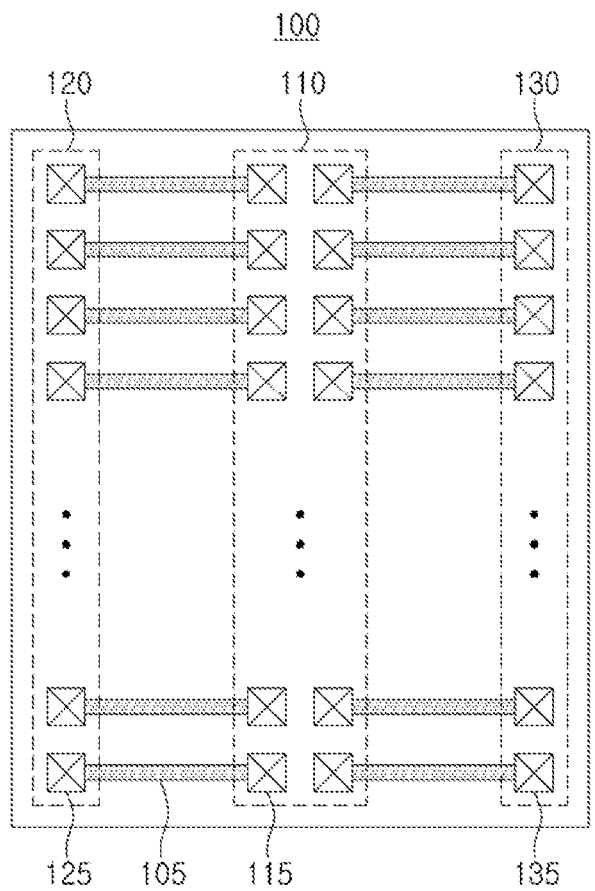
FIGS. 6 and 7 are diagrams schematically illustrating a semiconductor device according to an example embodiment.
Figure 7:
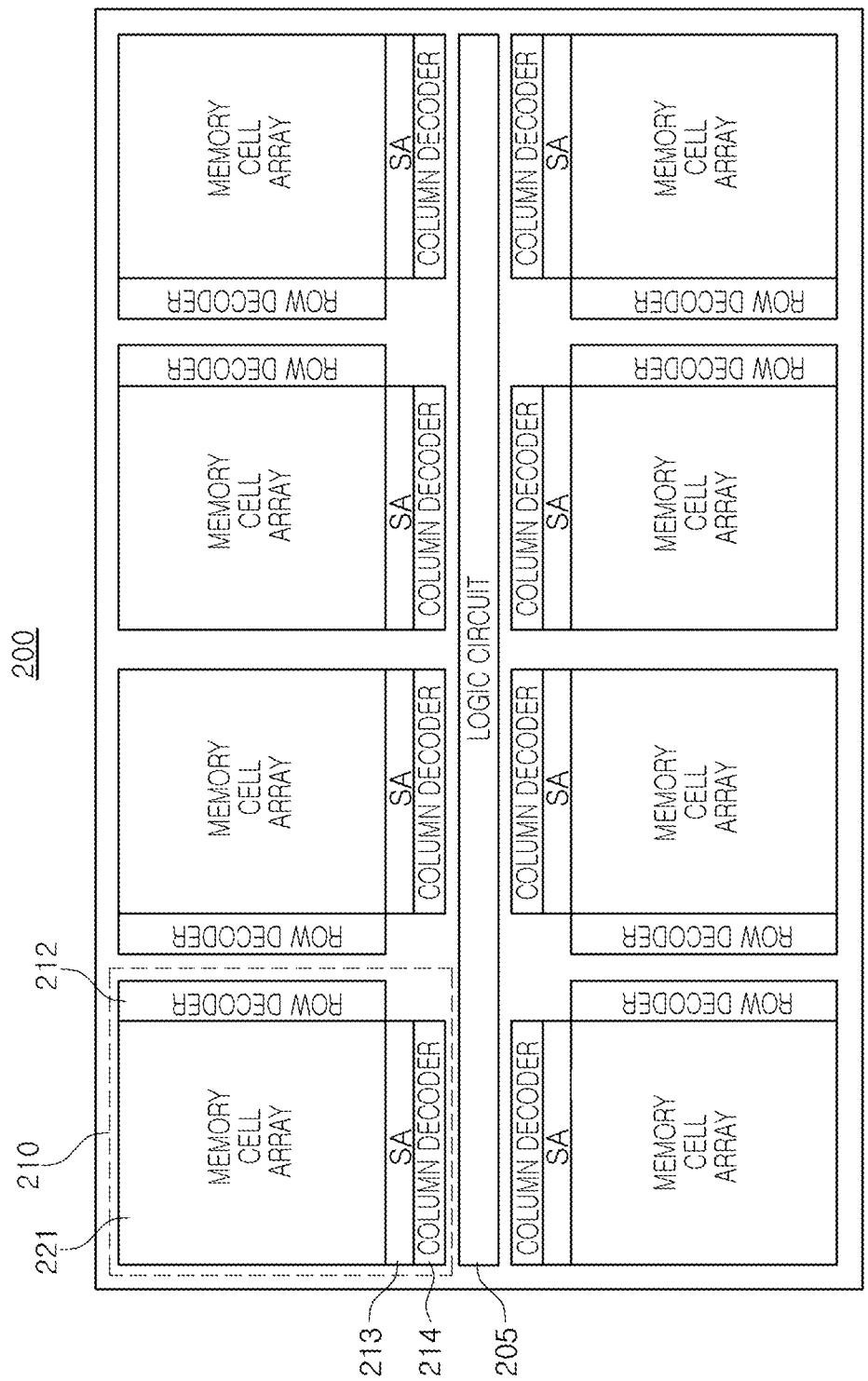

FIGS. 6 and 7 are diagrams schematically illustrating a semiconductor device according to an example embodiment.

First, referring to FIG. 6, a semiconductor device 100 may have a center pad structure in which center pads 115 are disposed in a center region 110. The center pads 115 may be connected to edge pads 125 and 135 (which are respectively disposed in edge regions 120 and 130 of the semiconductor device 100) by a redistribution layer 105.

The semiconductor device 100 may include a plurality of circuit elements formed on a semiconductor substrate, and a plurality of wiring patterns connected to the plurality of circuit elements. The plurality of wiring patterns may connect the plurality of circuit elements to each other, or may connect the plurality of circuit elements to the center pads 115. For example, in the semiconductor device 100, an input/output circuit connected to the center pads 115 may be disposed in the center region 110. Accordingly, the length of the wiring patterns connecting the input/output circuit and the center pads 115 may be shortened and parasitic components may be significantly reduced.

Referring to FIG. 7, a semiconductor device 200 may be a memory device and may include a plurality of unit memory regions 210.

The semiconductor device 200 may be a dynamic random access memory (DRAM), and the unit memory region 210 may be defined as a memory bank. Each of the plurality of unit memory regions 210 may include a memory cell array 211, a row decoder 212, a sense amplifier circuit 213, and a column decoder 214.

The operation of the semiconductor device 200 may be controlled by a logic circuit 205. The logic circuit 205 may store externally-received data in at least one of the plurality of unit memory regions 210 or read data from at least one of the plurality of unit memory regions 210 based on address information received from an external source, and may output the read data externally.

The logic circuit 205 may include an input/output circuit for sending and receiving signals to and from an external device. The plurality of unit memory regions 210 may be disposed on both or opposite sides of the logic circuit 205, and the logic circuit 205 may be disposed in the center region of the semiconductor device 200. Accordingly, by forming the semiconductor device 200 to have the center pad structure as in the example embodiment illustrated in FIG. 6, the length of the wiring patterns connecting the input/output circuit of the logic circuit 205 and the center pads 115 may be reduced, and parasitic components may be reduced. In the present example embodiment, at least one of the wiring patterns connecting the input/output circuit and the center pads 115 may include an inductor circuit providing a predetermined inductance.

The inductor circuit may be implemented in various shapes, and may have an adjustable inductance instead of a fixed inductance. Accordingly, the inductance of the inductor circuit may be increased or decreased according to the capacitance of a parasitic component present in the wiring patterns, and the integrity of a signal transmitted and received through the center pads 115 may be improved.

Figure 8:
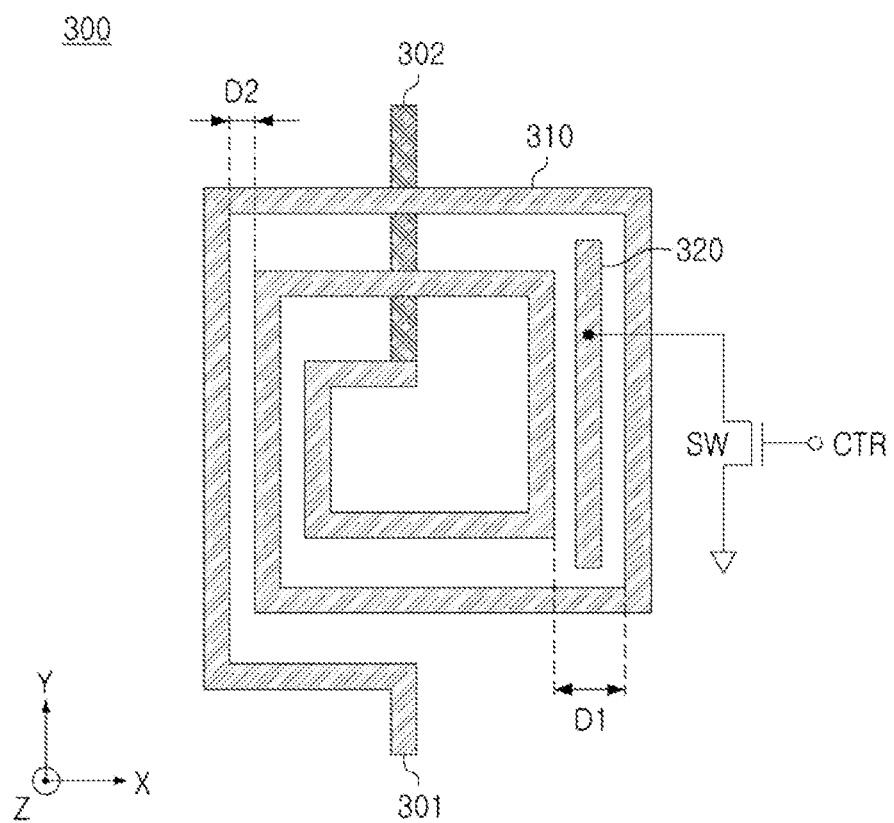
FIGS. 8 and 9 are diagrams schematically illustrating an inductor circuit included in a semiconductor device according to an example embodiment.
Figure 9:
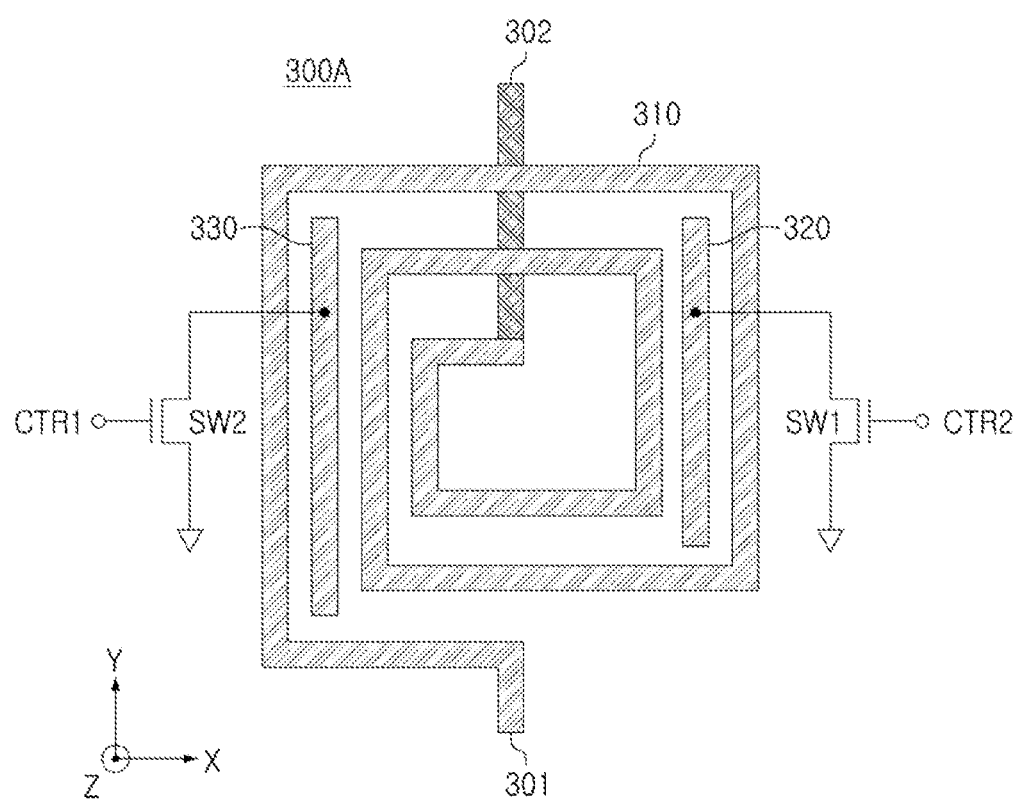

FIGS. 8 and 9 are diagrams schematically illustrating an inductor circuit included in a semiconductor device according to an example embodiment.

Referring to FIG. 8, a semiconductor device according to an example embodiment may include an inductor circuit 300 that includes an inductor pattern 310 and a variable pattern 320.

The inductor pattern 310 may include a coil pattern having a spiral shape, a first connection line 301 and a second connection line 302 connected to both sides of the coil pattern, and the like. The coil pattern may include a plurality of line patterns extending in a first direction (X-axis direction) or a second direction (Y-axis direction).

Referring to the example embodiment illustrated in FIG. 8, the first connection line 301 may be a line extending from a first end of an outer side of the coil pattern and may be disposed on the same layer as the coil pattern. The second connection line 302 may be a line extending from a second end of an inner side of the coil pattern and may be disposed on a layer different from that of the coil pattern. Accordingly, the first connection line 301 and the second connection line 302 may be disposed on different layers.

The variable pattern 320 may be physically separated from the inductor pattern 310, and may be connected to at least one switch element SW. When the switch element SW is turned off, the variable pattern 320 may be floated, and when the switch element SW is turned on, the variable pattern 320 may receive a ground power voltage. The switch element SW may be turned on/off by a control signal CTR provided by the semiconductor device including the inductor circuit 300.

In the region in which the variable pattern 320 is disposed, the spacing between the line patterns included in the inductor pattern 310 may vary. Referring to FIG. 8, a first interval D1 between some line patterns adjacent to the variable pattern 320 may be greater than a second interval D2 between some line patterns that are not adjacent to the variable pattern 320. For example, the width of the variable pattern 320 may be the same as the width of each of the line patterns, and in this case, the first interval D1 may be at least twice as large as the second interval D2.

As the variable pattern 320 floats or is connected to a ground power voltage, mutual inductance between lines adjacent to both sides of the variable pattern 320 may be adjusted. For example, the total inductance of the inductor circuit 300 when the variable pattern 320 is floating may be greater than the total inductance of the inductor circuit 300 when the variable pattern 320 is connected to the ground power voltage. Accordingly, the semiconductor device may turn on the switch element SW using the control signal CTR when the total inductance of the inductor circuit 300 is to be reduced.

Next, referring to FIG. 9, an inductor circuit 300A may include an inductor pattern 310, a first variable pattern 320, and a second variable pattern 330.

The first variable pattern 320 and the second variable pattern 330 may be disposed in different positions, and may be connected to a first switch element SW1 and a second switch element SW2, respectively. Accordingly, the first variable pattern 320 and the second variable pattern 330 may float independently or may be connected to a ground power voltage.

Referring to FIG. 9, the total inductance of the inductor circuit 300A may have a maximum value when both the first variable pattern 320 and the second variable pattern 330 are floated, and the first variable pattern 320 and the second variable pattern 330 may produce a minimum value of inductance when receiving the ground power voltage. Also, when one of the first variable pattern 320 and the second variable pattern 330 floats and the other receives a ground power voltage, the total inductance may have an intermediate value. Accordingly, compared to the example embodiment illustrated in FIG. 8, the total inductance of the inductor circuit 300A may be more variously adjusted.

FIGS. 10A to 10D are diagrams for describing operations of an inductor circuit included in a semiconductor device according to an example embodiment.

Figure 10A:
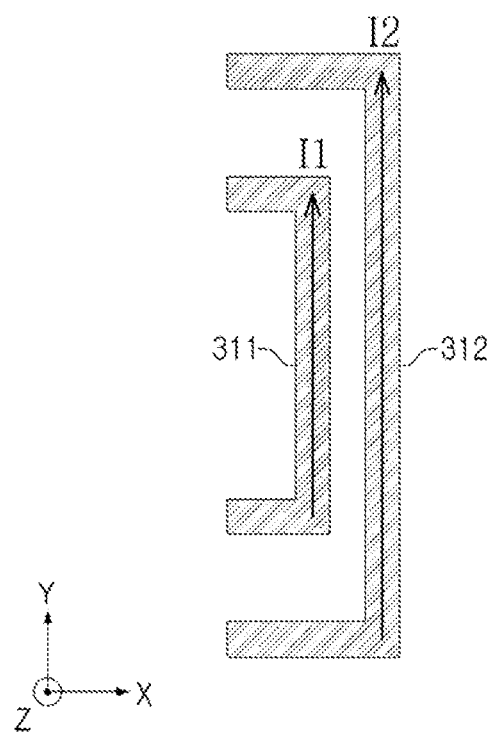
FIGS. 10A to 10D are diagrams for describing operations of an inductor circuit included in a semiconductor device according to an example embodiment.

FIG. 10A illustrates a portion of an inductor circuit, in which a variable pattern is not disposed.

Referring to FIG. 10A, an inductor circuit may include a first line 311 and a second line 312, and the first line 311 and the second line 312 may be adjacent in a first direction (X-axis direction) and extend in a second direction (Y-axis direction). The inductor circuit may include an inductor pattern having a spiral shape, e.g., as described above with reference to FIGS. 8 and 9, and the first line 311 and the second line 312 may be a portion of the inductor pattern. Accordingly, a first current I1 of the first line 311 and a second current I2 of the second line 312 may flow in the same direction.

In the portion of the inductor circuit illustrated in FIG. 10A, another pattern is not disposed between the first line 311 and the second line 312. Accordingly, in the portion of the inductor circuit illustrated in FIG. 10A, the inductance formed by the first line 311 and the second line 312 may be defined as [L1+L2+M1], in which L1 is a self-inductance generated in the first line 311 by the first current I1, L2 is a self-inductance generated in the second line 312 by the second current I2, and M1 is mutual inductance generated between the first line 311 and the second line 312 by the first current I1 and the second current I2. The inductance [L1+L2+M1] generated in the portion of the inductor circuit illustrated in FIG. 10A may not be adequate to prevent degradation of signal integrity due to parasitic components of the signal path to which the inductor circuit is connected. For example, to prevent deterioration in signal integrity due to a parasitic component, an inductance lower than the inductance [L1+L2+M1] may be called for.

Figure 10B:
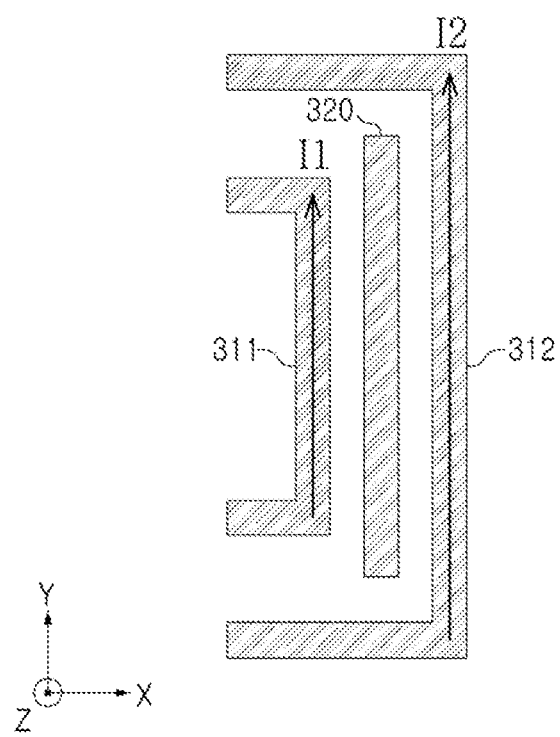
Figure 10C:
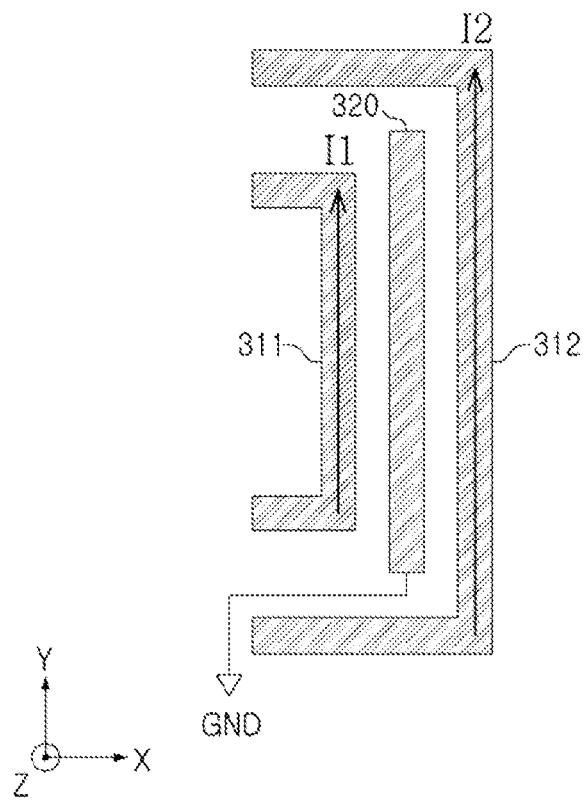

Similar to that described above, in an example embodiment illustrated in FIGS. 10B and 10C, the inductor circuit may include a first line 311 and a second line 312, the first line 311 and the second line 312 may be adjacent in a first direction (X-axis direction) and extend in a second direction (Y-axis direction), and the inductor circuit may include an inductor pattern having a spiral shape, and the first line 311 and the second line 312 may be a portion of the inductor pattern. Referring to FIGS. 10B and 10C, in the present example embodiment, by disposing a variable pattern 230 between the first line 311 and the second line 312 and floating the variable pattern or connecting the variable pattern to the ground power voltage, the total inductance generated in the first line 311 and the second line 312 may be reduced. This will be described in more detail.

Referring to FIG. 10B, the variable pattern 320 may be disposed between the first line 311 and the second line 312, with the variable pattern 320 being disposed between the first line 311 and the second line 312 in the first direction such that the first line 311 and the second line 312 are adjacent to both sides of the variable pattern 320 in the first direction.

In another implementation (not shown in FIGS. 10A and 10B), the variable pattern 320 may extend in the second direction, between the first line 311 and the second line 312.

In the example embodiment illustrated in FIG. 10B, the variable pattern 320 is floated. Accordingly, the total inductance generated by the first line 311 and the second line 312 may be defined as [L1+L2+M2]. The mutual inductance M2 (which is the mutual inductance generated between the first line 311 and the second line 312) may have a lower value than the mutual inductance M1 described above with reference to FIG. 10A. In the example embodiment illustrated in FIG. 10B, the variable pattern 320 is disposed between the first line 311 and the second line 312 such that the interval between the first line 311 and the second line 312 is increased, and as a result, the mutual inductance M2 between the first line 311 and the second line 312 may decrease as compared to the mutual inductance M1 of FIG. 10A.

Next, referring to FIG. 10C, the variable pattern 320 disposed between the first line 311 and the second line 312 in the first direction, with the first line 311 and the second line 312 adjacent to both sides of the variable pattern 320 in the first direction, may be connected to a ground power voltage GND. In the example embodiment illustrated in FIG. 10C, the distance between the first line 311 and the second line 312 is increased by the variable pattern 320 to obtain the effect of reducing the mutual inductance, and further, by biasing the variable pattern 320 to the ground power voltage GND, the mutual inductance may be further reduced. Therefore, to reduce the inductance of the inductor circuit in consideration of the parasitic component between the input/output circuit and the pad of the semiconductor device, the switch element connected to the variable pattern 320 may be turned on to bias the variable pattern 320 to the ground power voltage GND or the like, as illustrated in FIG. 10C.

In an implementation (not shown), the variable pattern 320 may also be biased to a voltage other than the ground power voltage.

Figure 10D:
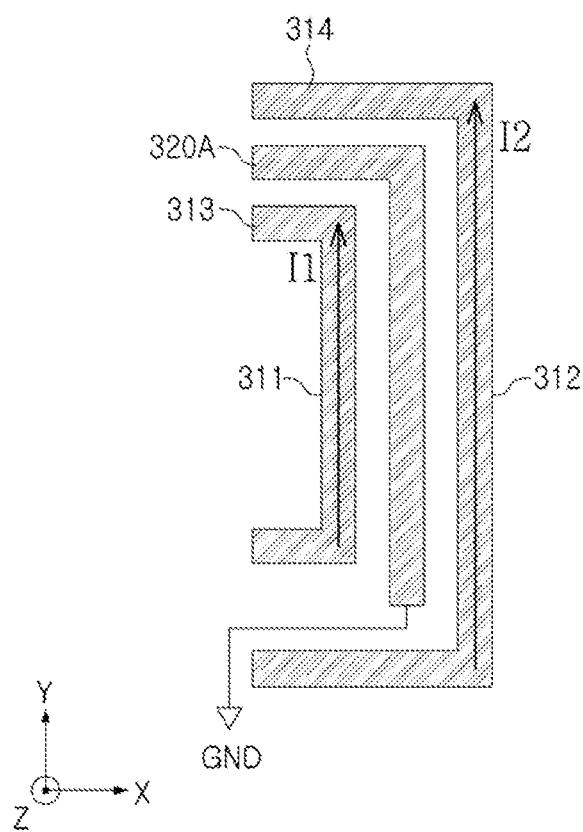

Similar to that described above, in an example embodiment illustrated in FIGS. 10B and 10C, the inductor circuit may include a first line 311 and a second line 312, the first line 311 and the second line 312 may be adjacent in a first direction (X-axis direction) and extend in a second direction (Y-axis direction), and the inductor circuit may include an inductor pattern having a spiral shape, and the first line 311 and the second line 312 may be a portion of the inductor pattern. Referring to FIG. 10D, a variable pattern 320A may include both a region extending in the first direction and a region extending in the second direction. Accordingly, the variable pattern 320A may be disposed not only between the first line 311 and the second line 312 extending in the second direction, but also between a third line 313 and a fourth line 314 extending in the first direction.

FIGS. 11A to 11D are diagrams schematically illustrating an inductor circuit included in a semiconductor device according to an example embodiment.

Referring to FIGS. 11A to 11D, an inductor circuit according to an example embodiment may include a first line 311 and a second line 312 and a plurality of variable patterns 320, 330A and 330B.

The first line 311 and the second line 312 may be adjacent to each other in the first direction (X-axis direction). The first line 311, the second line 312, and the plurality of variable patterns 320, 330A and 330B may extend in a second direction (Y-axis direction).

Figure 11A:
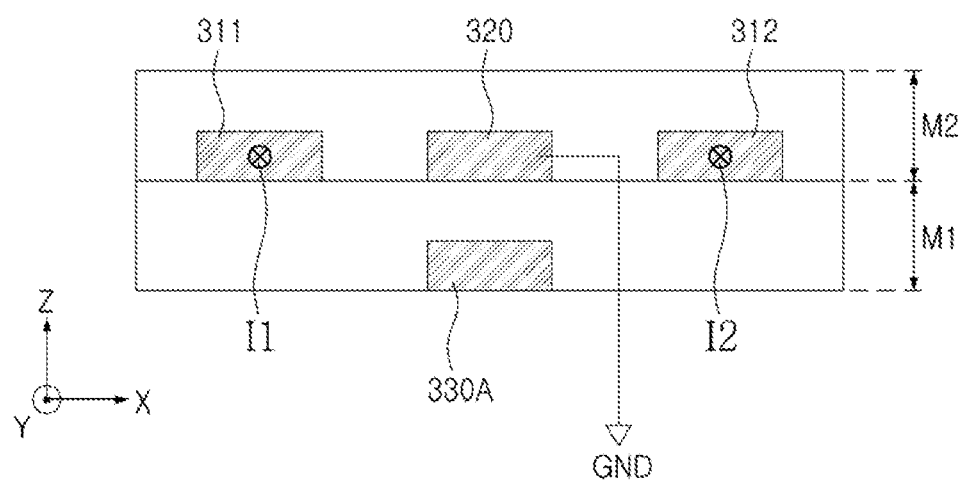
FIGS. 11A to 11D are diagrams schematically illustrating an inductor circuit included in a semiconductor device according to an example embodiment.
Figure 11B:
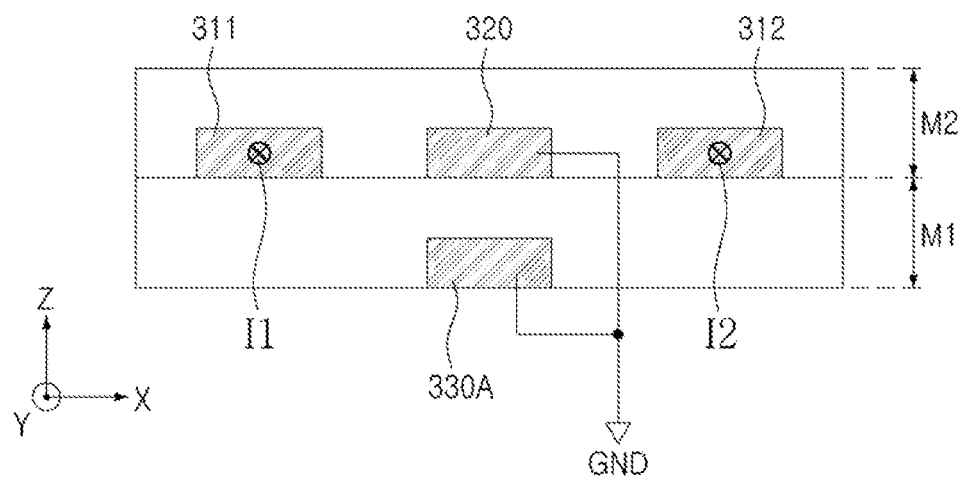

Referring to FIGS. 11A and 11B, the first line 311, the second line 312 and the variable patterns 320 and 330A may be disposed in a first layer M1 and a second layer M2. For example, the first variable pattern 320 may be disposed in the second layer M2 together with the first line 311 and the second line 312, and the second variable pattern 330A may be formed in the first layer M1. As described above with reference to FIGS. 8 and 9, the inductor pattern may include a spiral-shaped coil pattern, a first connection line 301 extending from the outer side of the coil pattern, and a second connection line 302 extending from the inner side of the coil pattern, and the second connection line 302 may be disposed on a layer different from the layer of the first connection line 301 and the coil pattern. In the present example embodiment, the first connection line 301 may be disposed in the same first layer M1 as the second variable pattern 330A.

In the present example embodiment, referring to FIG. 11A, a first current I1 and a second current I2 may flow in the second direction, and the first variable pattern 320 may be biased to a ground power voltage.

In another state (not shown in FIG. 11A), the second variable pattern 330A may be floating.

In another state, referring to FIG. 11B, both the first variable pattern 320 and the second variable pattern 330A may be biased to the ground power voltage. Accordingly, compared to the total inductance provided by the inductor circuit in the example embodiment illustrated in FIG. 11A, the total inductance provided by the inductor circuit in the example embodiment illustrated in FIG. 11B may be lower. This is because in the example embodiment illustrated in FIG. 11B, both the first variable pattern 320 and the second variable pattern 330A are biased to the ground power voltage, such that the mutual inductance between the first and second lines 311 and 312 may be further greatly reduced relative to the example embodiment illustrated in FIG. 11A.

Figure 11C:
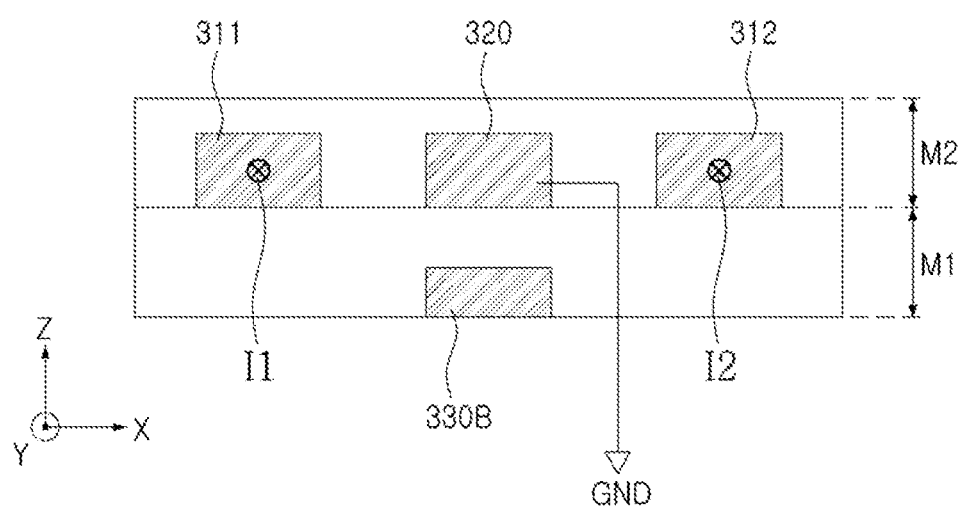
Figure 11D:
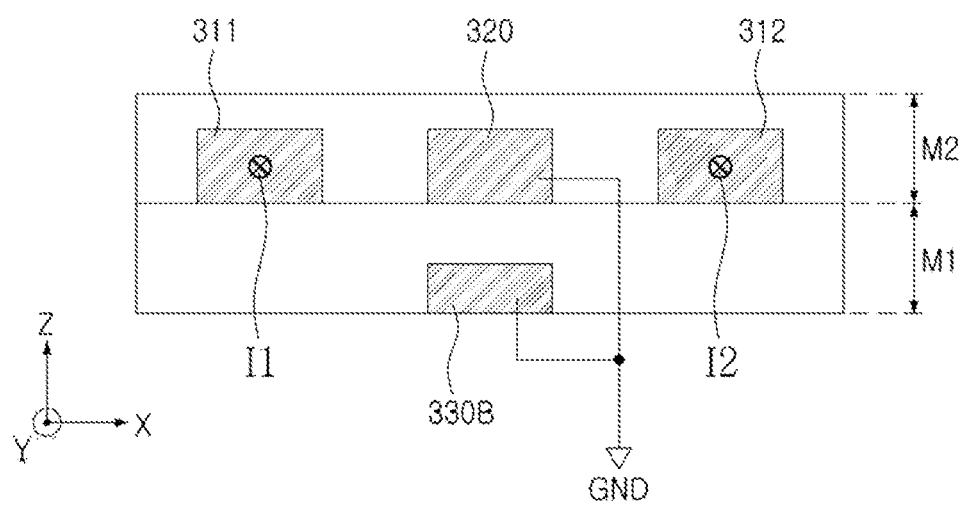

Referring to FIGS. 11C and 11D, the first line 311, the second line 312, and the variable patterns 320 and 330B may be disposed in the first layer M1 and the second layer M2. In the present example embodiment, referring to FIGS. 11C and 11D, the thickness of the first variable pattern 320, the first line 311, and the second line 312 in the second layer M2 may be greater than the thickness of the second variable pattern 330B in the first layer M1. By forming the coil patterns and the first variable pattern 320 in the second layer M2 to be thicker, the resistance of the inductor circuit may be lowered.

The total inductance provided by the inductor circuit may be determined similarly to that described above with reference to FIGS. 11A and 11B. In the example embodiment illustrated in FIG. 11C, the first variable pattern 320 is biased to a ground power supply voltage and the second variable pattern 330B is floated, whereas in the example embodiment illustrated in FIG. 11D, both the first variable pattern 320 and the second variable pattern 330B are biased to the ground power voltage. Accordingly, compared to the total inductance provided by the inductor circuit in the example embodiment illustrated in FIG. 11C, the total inductance provided by the inductor circuit in the example embodiment illustrated in FIG. 11D may be relatively lower.

Figure 12:
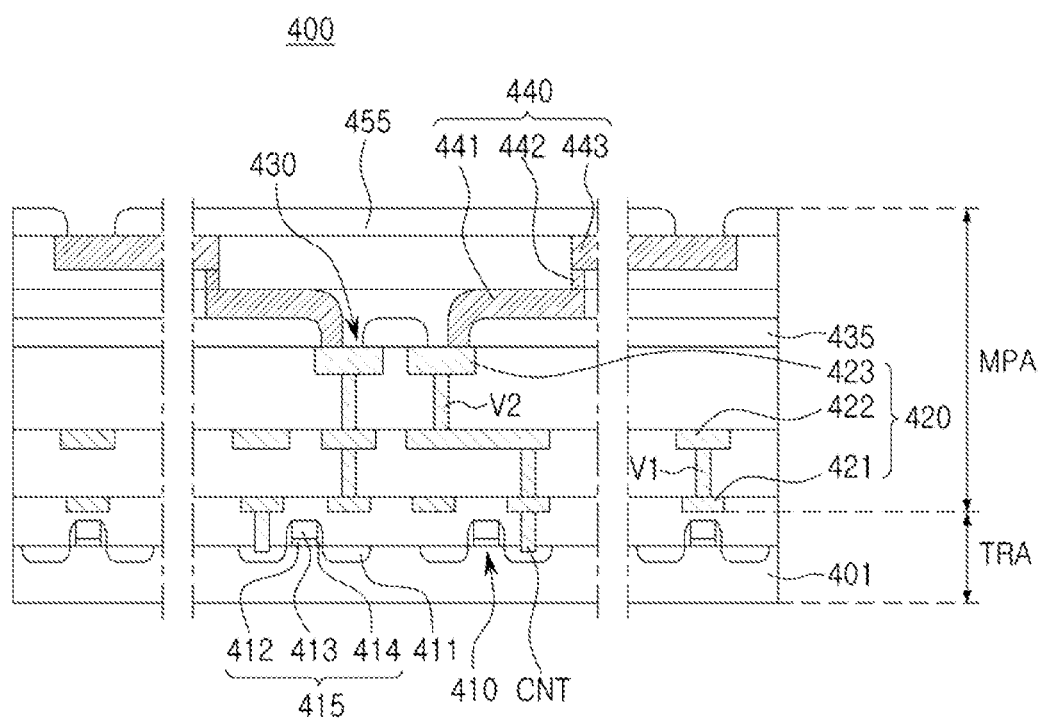
FIGS. 12 and 13 are diagrams schematically illustrating a semiconductor device according to an example embodiment.
Figure 13:
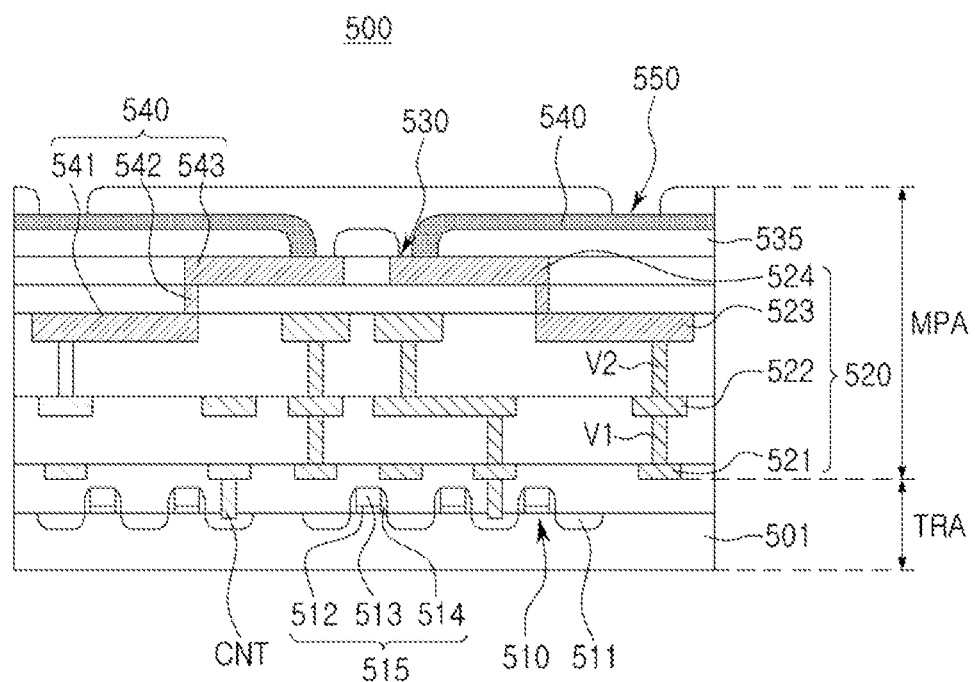

FIGS. 12 and 13 are diagrams schematically illustrating a semiconductor device according to an example embodiment.

Referring first to FIG. 12, a semiconductor device 400 according to an example embodiment may include an inductor circuit.

The semiconductor device 400 may include a device region TRA and an interconnection region MPA. The device region TRA may include a semiconductor substrate 401 and a plurality of elements 410 formed on the semiconductor substrate 401. The interconnection region MPA may include a plurality of wiring patterns 420 connected to the plurality of elements 410, and redistribution layers 440 connected to the plurality of wiring patterns 420.

The plurality of elements 410 may include transistors formed on the semiconductor substrate 401. For example, each of the plurality of elements 410 may include a source/drain region 411 and a gate structure 415. The gate structure 415 may include a gate insulating layer 412, a gate electrode layer 413, and a gate spacer 414. A device contact CNT may be connected to the source/drain region 411 and the gate structure 415, and the device contact CNT may be connected to at least one of the plurality of wiring patterns 420.

The plurality of wiring patterns 420 may be dividedly disposed on a plurality of wiring layers 421-423. For example, the first wiring patterns disposed in the first wiring layer 421 may be connected to the plurality of elements 410 through the device contact CNT. The second wiring patterns disposed in the second wiring layer 422 may be connected to the lower wiring patterns through a first via structure V1, and the third wiring patterns disposed in the third wiring layer 423 may be connected to intermediate wiring patterns through a second via structure V2. In the example embodiment illustrated in FIG. 12, the wiring patterns 420 are illustrated as being disposed in three wiring layers 421-423, but the number of wiring layers in which the wiring patterns 420 are disposed may be variously modified.

A thickness of each of the plurality of wiring patterns 420 may be determined according to the wiring layers 421-423 on which the wiring patterns 420 are respectively disposed. For example, referring to FIG. 12, the thicknesses of the first wiring patterns disposed in the first wiring layer 421 may be the smallest, whereas the thicknesses of the third wiring patterns disposed in the third wiring layer 423 may be the greatest. As the distance from the semiconductor substrate 401 in a direction perpendicular to the upper surface of the semiconductor substrate 401 increases, the thickness of the wiring patterns 420 may increase.

At least some areas of the third wiring patterns disposed in the third wiring layer 423 may provide a plurality of center pads 430. The center pads 430 may be pads disposed in the center region of the semiconductor device 400, and may be exposed by a first passivation layer 435. The center pads 430 may be connected to redistribution layers 440 formed in a position higher than the third wiring layer 423.

The redistribution layers 440 may include a first redistribution layer 441, an RDL via 442 (redistribution layer via), and a second redistribution layer 443. The first redistribution layer 441 may be a layer directly connected to the center pads 430, and may be connected to the second redistribution layer 443 through the RDL via 442. At least a portion of the second redistribution layer 443 may provide edge pads 450 disposed in an edge region of the semiconductor device 400. The edge pads 450 may be exposed to the outside by the second passivation layer 455, and may be connected to, e.g., pads of a substrate on which the semiconductor device 400 is mounted, through a wire or the like.

In the semiconductor device 400 according to the example embodiment illustrated in FIG. 12, the inductor circuit may be formed in the redistribution layers 440 connecting the center pad 430 and the edge pad 450.

The inductor circuit may include a spiral-shaped coil pattern, as described above, and at least two layers may be used to form the inductor circuit. For example, in the example embodiment illustrated in FIG. 12, the redistribution layers 440 are implemented using the first redistribution layer 441 and the second redistribution layer 443 (which are respectively formed at different heights from the upper surface of the semiconductor substrate 401), and form the inductor circuit in the redistribution layers 440.

In further detail, the first redistribution layer 441 may include a first connection line extending from the inside of the coil pattern, and the second redistribution layer 443 may include a coil pattern and a second connection line extending from the outside of the coil pattern. Also, a variable pattern separated from the coil pattern and adjacent to the coil pattern may be formed on the second redistribution layer 443.

The variable pattern may be connected to at least one switch element among the plurality of elements 410, and by turning the switch element off to float the variable pattern or turning the switch element on to bias the variable pattern to the power supply voltage, the inductance of the inductor circuit may be adjusted. By adjusting the inductance of the inductor circuit, degradation of signal integrity due to parasitic components present in the interconnection region MPA may be significantly reduced, and the eye margin of a signal may be improved.

Referring to FIG. 13, a semiconductor device 500 according to an example embodiment may include a device region TRA and an interconnection region MPA. The device region TRA may include a semiconductor substrate 501 and a plurality of elements 510. The configuration of the plurality of elements 510 may be similar to that described above with reference to FIG. 12.

In the example embodiment illustrated in FIG. 13, the interconnection region MPA may include a plurality of wiring patterns 520 connected to the plurality of elements 510, and redistribution layers 550 connected to the plurality of wiring patterns 520, and the like. The plurality of wiring patterns 520 may be dividedly disposed on the plurality of wiring layers 521-524, and the first wiring patterns disposed on the first wiring layer 521 may be connected to the plurality of elements 510 through a device contact CNT. As the distance from the upper surface of the semiconductor substrate 501 increases, the thickness of the wiring patterns 520 may increase.

In the example embodiment illustrated in FIG. 13, an inductor circuit may be formed in a third wiring layer 523 and a fourth wiring layer 524 disposed on the highest positions among the wiring patterns 520. As described above, when the inductor circuit includes a spiral-shaped coil pattern, at least two layers may be used to implement the inductor circuit. In the example embodiment illustrated in FIG. 13, an inductor circuit may be implemented using the third wiring layer 523 and the fourth wiring layer 524.

In further detail, a first connection line extending from the inside of the coil pattern may be formed in the third wiring layer 523. In addition, a coil pattern, a second connection line extending from the outside of the coil pattern, and a variable pattern separated from the coil pattern and adjacent to the coil pattern may be formed in the fourth wiring layer 524. By forming the coil pattern, the second connection line, the variable pattern, and the like on the fourth wiring layer 524 having a greatest thickness among layers of the wiring patterns 520, the resistance of the inductor circuit may be significantly reduced.

At least a partial region of the second connection line connected to the coil pattern is exposed to the outside by a first passivation layer 535, in the center region of the semiconductor device 500, and may provide center pads 530. The center pads 530 may be connected to the redistribution layers 550. At least some regions of the redistribution layers 550 may be exposed externally by a second passivation layer 555 to provide edge pads 560.

In the example embodiment illustrated in FIG. 12, the inductor circuit may be formed on the redistribution layers 440 connected to the center pads 430 of the semiconductor device 400. On the other hand, in the example embodiment illustrated in FIG. 13, the inductor circuit may be formed using some of the wiring layers 523 and 524 connected to the redistribution layers 550, among the layers of the wiring patterns 520 of the semiconductor device 500. As described with reference to FIGS. 12 and 13, the inductor circuit may be formed of wiring patterns having a relatively great thickness, and thus the resistance of the inductor circuit may be reduced, thereby significantly reducing deterioration of performance of the semiconductor device 400, 500 due to the inductor circuit.

Figure 14A:
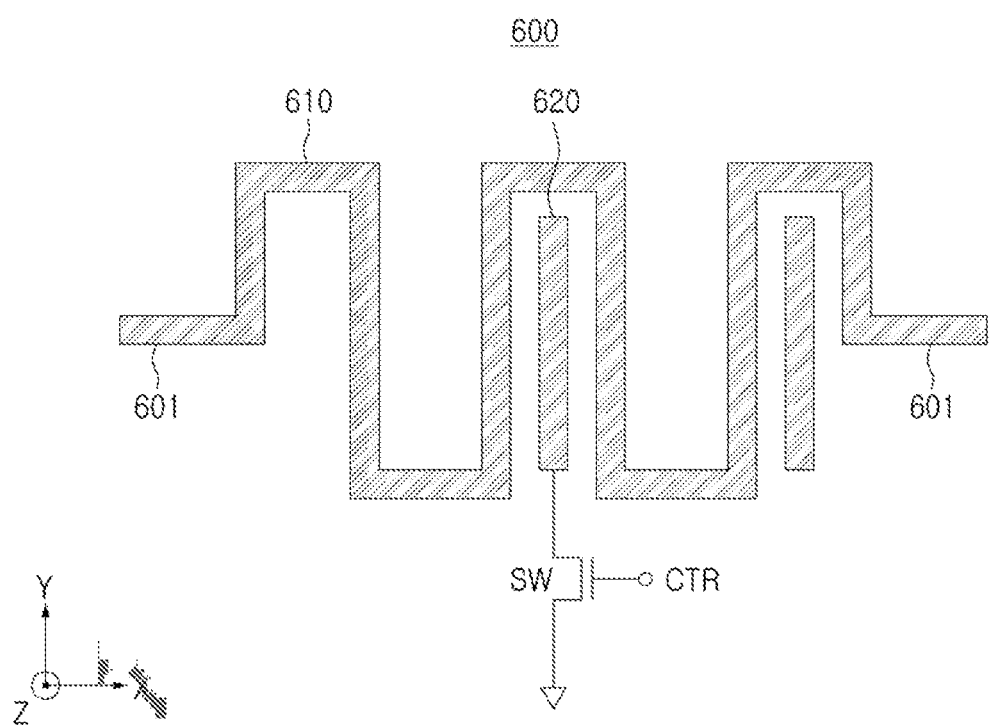
FIGS. 14A and 14B are diagrams schematically illustrating an inductor circuit included in a semiconductor device according to an example embodiment.
Figure 14B:
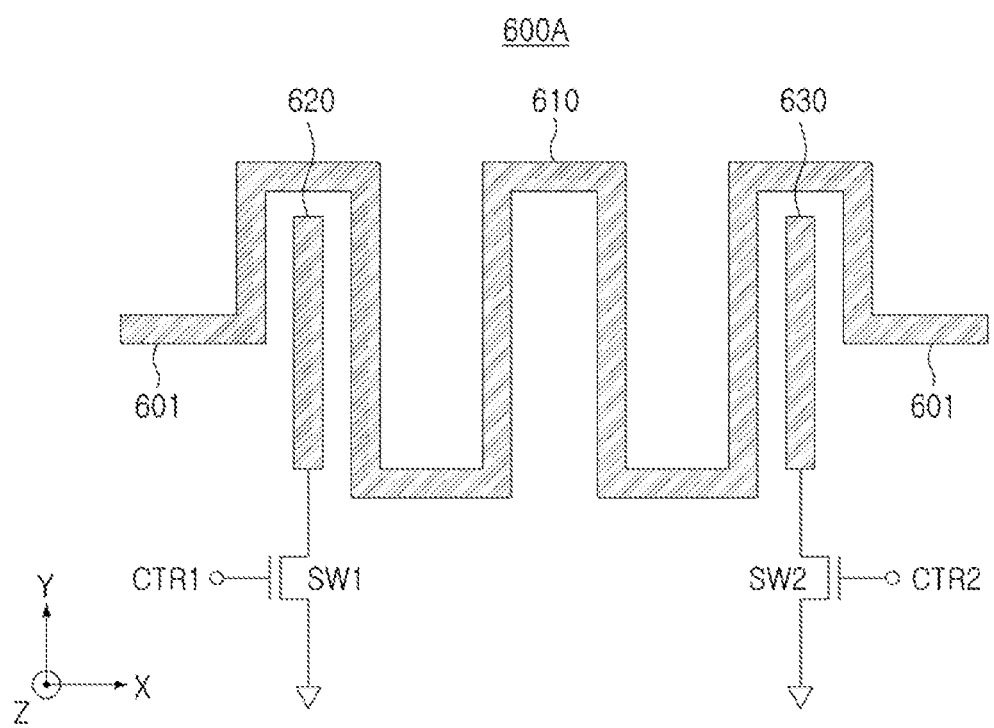

FIGS. 14A and 14B are diagrams schematically illustrating an inductor circuit included in a semiconductor device according to an example embodiment.

Referring to FIG. 14A, an inductor circuit 600 according to an example embodiment includes an inductor pattern 610 and a variable pattern 620. The inductor pattern 610 may include a coil pattern, and a first connection line 601 and a second connection line 602 connected to both sides of the coil pattern, and the like.

The first connection line 601 may be a line extending from one side of the coil pattern, and the second connection line 602 may be a line extending from the other side of the coil pattern. In the example embodiment illustrated in FIG. 14, the first connection line 601 and the second connection line 602 may be disposed on the same layer as the coil pattern. Accordingly, the inductor pattern 610 may be disposed on one layer.

The variable pattern 620 may be physically separated from the inductor pattern 610 and may be connected to at least one switch element SW. For example, when the switch element SW is turned off, the variable pattern 620 may float, and when the switch element SW is turned on, the variable pattern 620 may receive a ground power voltage.

In another implementation (not shown), the variable pattern 620 may receive a power voltage other than the ground power voltage, as a bias voltage, by turning on the switch element SW.

The switch element SW may be turned on/off by a control signal CTR provided by the semiconductor device that includes the inductor circuit 600.

Mutual inductance between lines adjacent to both sides of the variable pattern 620 may be adjusted by disposing the variable pattern 620 therebetween, and floating the variable pattern 620 or connecting the variable pattern 620 to a ground power voltage. For example, the total inductance of the inductor circuit 300 when the variable pattern 620 is floating may be different from the total inductance of the inductor circuit 300 when the variable pattern 620 is connected to the ground power voltage. Accordingly, the semiconductor device may be set to a condition in which the eye margin of a signal input/output by the semiconductor device is significantly increased by turning the switch element SW on or off, and may set the switch element SW with reference to the conditions.

Referring to FIG. 14B, an inductor circuit 600A may include an inductor pattern 610, a first variable pattern 620, and a second variable pattern 630. The first variable pattern 620 and the second variable pattern 630 may be disposed at different positions, and may be connected to a first switch element SW1 and a second switch element SW2, respectively. Accordingly, the first variable pattern 620 and the second variable pattern 630 may each float independently or be connected to a ground power supply voltage.

In the example embodiment illustrated in FIG. 14B, the total inductance of the inductor circuit 600A may have a minimum value when both the first variable pattern 620 and the second variable pattern 630 are floated, and may have a maximum value when both the first variable pattern 620 and the second variable pattern 630 are biased to the ground power voltage. Also, when one of the first variable pattern 620 and the second variable pattern 630 floats and the other receives a ground power voltage, the total inductance may have an intermediate value. Accordingly, compared to the example embodiment illustrated in FIG. 14A, the total inductance of the inductor circuit 600A may be adjusted more variously.

Figure 15A:
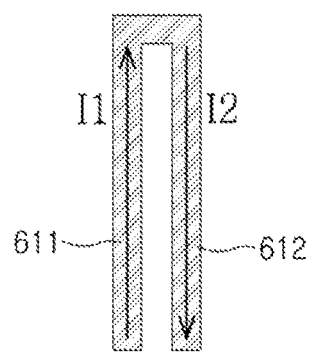
FIGS. 15A to 15C are diagrams for describing operations of an inductor circuit included in a semiconductor device according to an example embodiment.
Figure 15A:
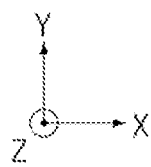
Figure 15B:
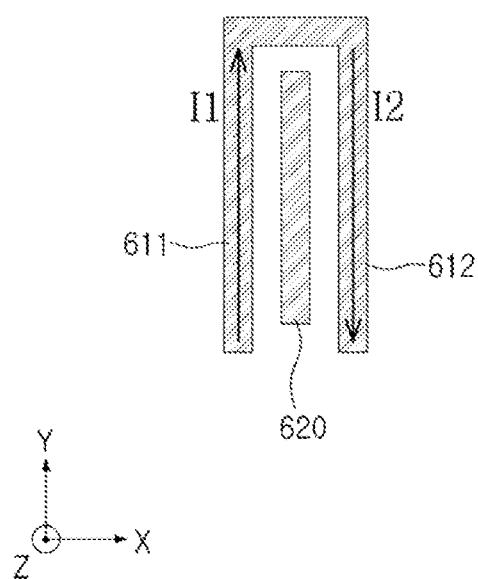
Figure 15C:
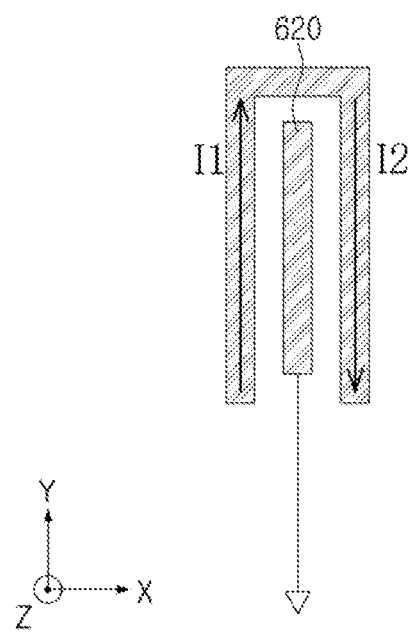

FIGS. 15A to 15C are diagrams for describing operations of an inductor circuit included in a semiconductor device according to an example embodiment.

FIG. 15A illustrates a portion of an inductor circuit, in which a variable pattern is not disposed.

In FIGS. 15A to 15C, the inductor circuit may include a first line 611 and a second line 612, and the first line 611 and the second line 612 may be adjacent in a first direction (X-axis direction), and may extend in a second direction (Y-axis direction). Here, the inductor circuit includes an inductor pattern having the shape as described above with reference to FIGS. 14A and 14B, and the first line 611 and the second line 612 may be a portion of the inductor pattern.

Accordingly, a first current I1 of the first line 611 and a second current I2 of the second line 612 may flow in opposite directions.

In the portion of the inductor circuit illustrated in FIG. 15A, another pattern is not disposed between the first line 611 and the second line 612. Accordingly, in the portion of the inductor circuit illustrated in FIG. 15A, the inductance formed by the first line 611 and the second line 612 may be defined as [L1−L2]. L1 may be a self-inductance generated in the first line 611 by the first current I1, and L2 may be a self-inductance generated in the second line 612 by the second current I2. Since the first current I1 and the second current I2 flow in opposite directions, the self-inductances generated in the first line 611 and the second line 612, respectively, may have an effect of canceling each other. The inductance generated in the portion of the inductor circuit illustrated in FIG. 15A may not be suitable for preventing degradation of signal integrity due to parasitic components of a signal path to which the inductor circuit is connected. For example, to prevent degradation of signal integrity due to a parasitic component, an inductance greater than the inductance [L1−L2] may be called for.

In an example embodiment illustrated in FIGS. 15B and 15C, by disposing a variable pattern between the first line 611 and the second line 612 and floating the variable pattern or connecting the variable pattern to the ground power supply voltage, the total inductance generated by the first line 611 and the second line 612 may be increased. This will now be described in more detail with reference to FIGS. 15B and 15C.

First, referring to FIGS. 15B and 15C, the variable pattern 620 is disposed between the first line 611 and the second line 612, and thus, the spacing between the first line 611 and the second line 612 in the first direction may increase. Accordingly, an effect of cancelling the inductance L1 generated in the first line 611 and the inductance L2 generated in the second line 612 from each other may be reduced, and the overall inductance of the inductor circuit may be increased.

Referring to FIG. 15B, the variable pattern 620 may be floated. Referring to FIG. 15C, the variable pattern 620 may be biased to a ground power voltage. A shielding effect may be provided by increasing the interval between the first line 611 and the second line 612 in the first direction. Also, by biasing the variable pattern 620 to the ground power voltage, and thus, the total inductance of the inductor circuit may be further significantly increased, compared with the example embodiment illustrated in FIG. 15B.

In an implementation (not shown), the variable pattern 620 may be biased to a voltage other than the ground power voltage.

Figure 16:
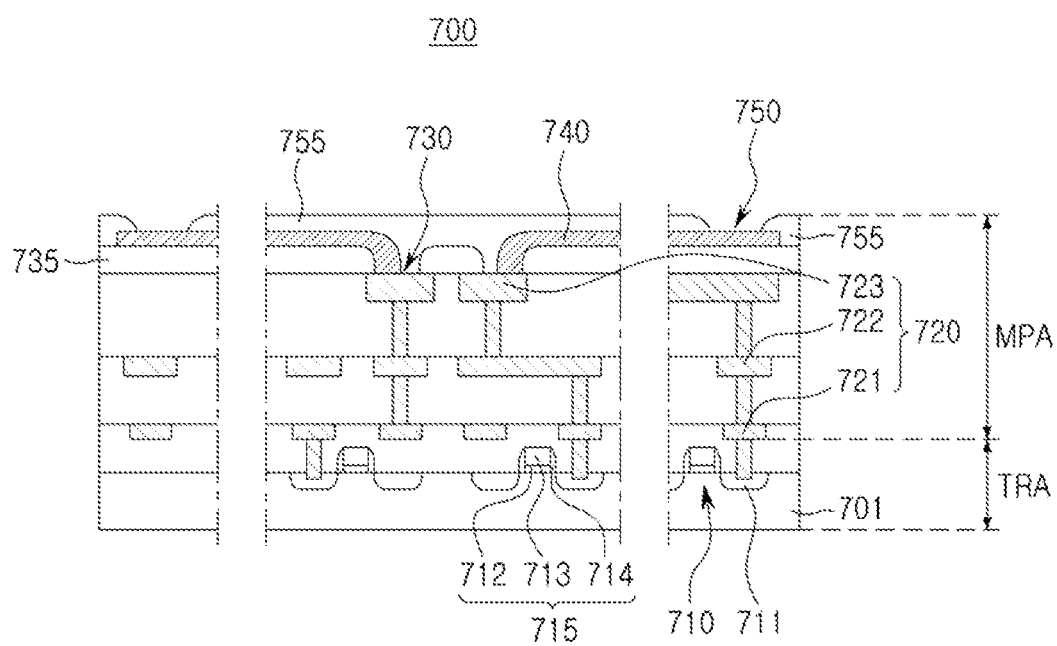
FIG. 16 is a diagram schematically illustrating a semiconductor device according to an example embodiment.

FIG. 16 is a diagram schematically illustrating a semiconductor device according to an example embodiment.

Referring to FIG. 16, a semiconductor device 700 according to an example embodiment may include an inductor circuit.

The semiconductor device 700 may include a device region TRA and an interconnection region MPA. The device region TRA may include a semiconductor substrate 701 and a plurality of elements 710 formed on the semiconductor substrate 701, and the configuration of the plurality of elements 710 may be similar to that described above with reference to FIGS. 12 and 13. The interconnection region MPA may include a plurality of wiring patterns 720 connected to the plurality of elements 710, redistribution layers 740 connected to the plurality of wiring patterns 720, and the like.

The plurality of wiring patterns 720 may be dividedly disposed on the plurality of wiring layers 721-723, and the thickness of each of the plurality of wiring patterns 720 may be determined by the wiring layers 721-723 on which the wiring patterns 720 are respectively disposed. Referring to FIG. 16, the thickness of the first wiring patterns disposed on the first wiring layer 721 may be lower than the thickness of the third wiring patterns disposed on the third wiring layer 723.

At least some regions of the third wiring patterns disposed on the third wiring layer 723 may provide a plurality of center pads 730. The center pads 730 may be pads disposed in the center region of the semiconductor device 700, and may be exposed by the first passivation layer 735. The center pads 730 may be connected to the redistribution layer 740, on the first passivation layer 735.

The inductor circuit may be formed on the redistribution layer 740, and the inductor circuit may have a shape as described above with reference to FIGS. 14A and 14B. Accordingly, all wiring patterns providing the inductor circuit may be formed on one layer, and the inductor circuit may be implemented with only one redistribution layer 740. The inductor circuit formed in the redistribution layer 740 may include an inductor pattern and a variable pattern.

The variable pattern may be connected to at least one switch element among the plurality of elements 710, and by turning the switch element off to float the variable pattern or turning the switch element on to bias the variable pattern to the power supply voltage, the inductance of the inductor circuit may be adjusted. By adjusting the inductance of the inductor circuit, degradation of signal integrity due to parasitic components present in the interconnection region MPA and the like may be prevented, and the eye margin of the signal may be improved.

Figure 17:
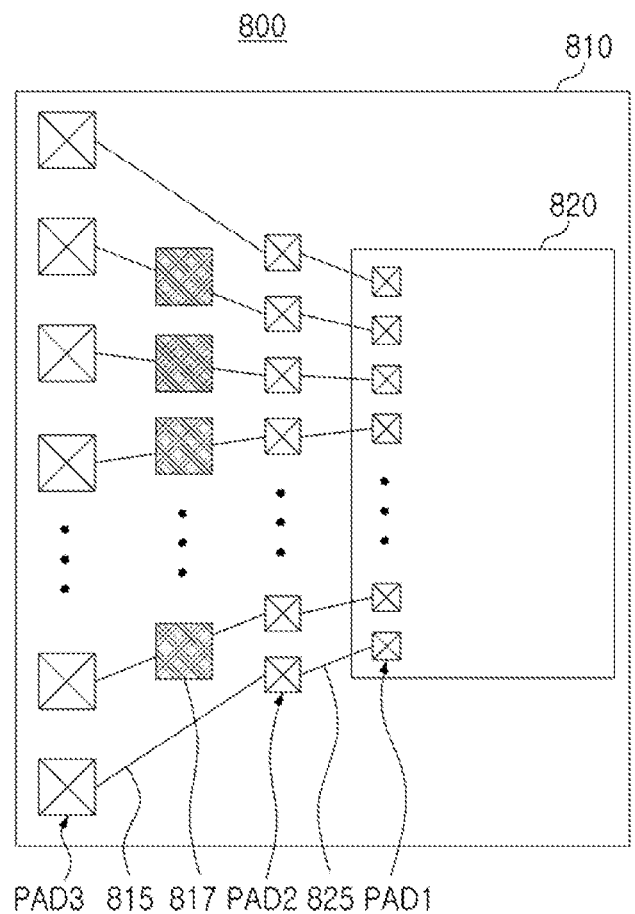
FIG. 17 is a schematic diagram illustrating a semiconductor device according to an example embodiment.

FIG. 17 is a schematic diagram illustrating a semiconductor module including a semiconductor device according to an example embodiment.

Referring to FIG. 17, a semiconductor module 800 according to an example embodiment may include a module substrate 810 and a semiconductor device 820. The semiconductor device 820 may include an inductor circuit.

The semiconductor device 820 may be mounted on the module substrate 810. The semiconductor device 820 may include a plurality of first pads PAD1, and the first pads PAD1 may be connected to a plurality of second pads PAD2 formed on the module substrate 810 via wires 825. For example, the first pads PAD1 may be edge pads provided by redistribution layers included in the semiconductor device 820.

The second pads PAD2 may be connected to the third pads PAD3 through substrate wirings 815 formed on the module substrate 810. The third pads PAD3 may be pads for connecting the semiconductor module 800 to other external semiconductor devices, semiconductor modules, substrates, and the like.

As described above, the semiconductor device 820 may include an inductor circuit for securing signal integrity. For example, the inductor circuit may be connected between the first pads PAD1 and the input/output circuit of the semiconductor device 820, and may include an inductor pattern and a variable pattern. The variable pattern is separated from the inductor pattern and is a pattern adjacent to the inductor pattern, and may be floated or may receive a predetermined power supply voltage as a bias voltage. In the manufacture of the semiconductor device 820, the inductor circuit may be set to provide an inductance value capable of securing signal integrity by measuring the eye margin of a signal input/ output by the semiconductor device 820 while floating a variable pattern or biasing the variable pattern to a power supply voltage.

On the other hand, in the example embodiment illustrated in FIG. 17, an inductor circuit 817 may also be formed on at least one of substrate wirings 815 connecting second pads PAD2 and third pads PAD3. For example, the inductor circuit 817 may be formed on a signal path that transmits and receives signals at high speed. When the semiconductor device 820 is a memory device, the inductor circuit 817 may be connected to a portion of the third pads PAD3 that transmits and receives data signals.

Figure 18:
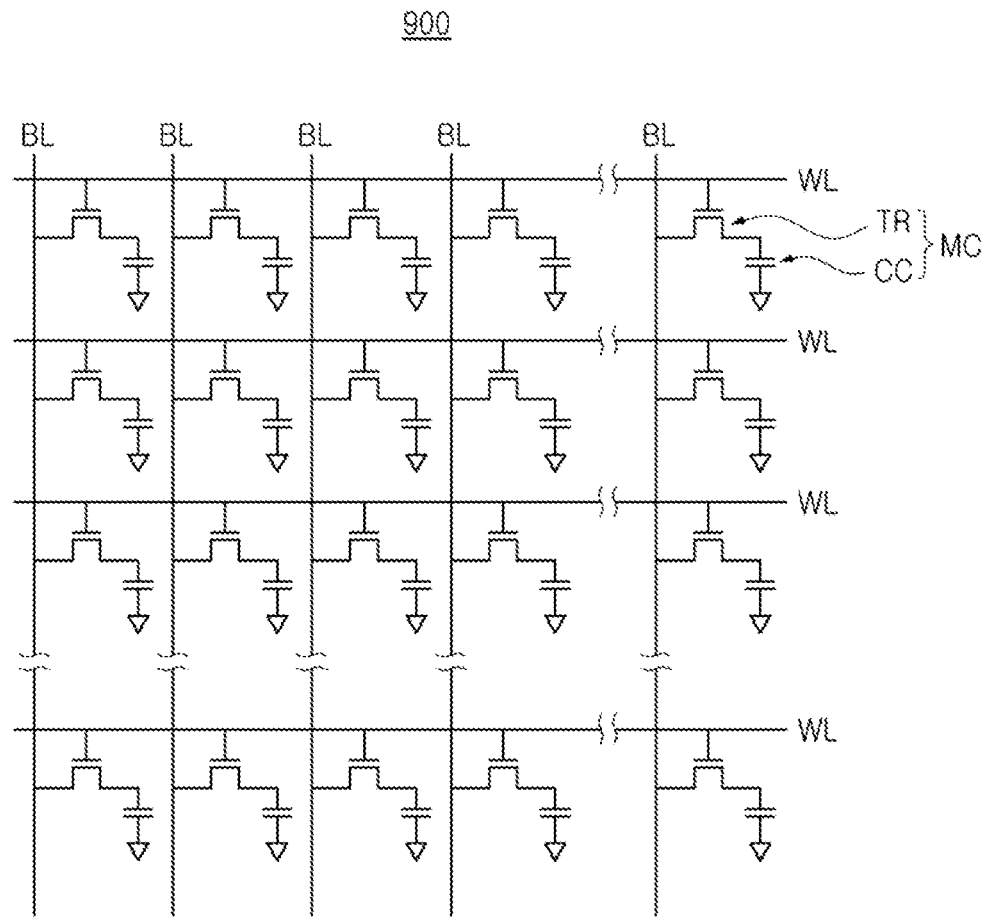
FIGS. 18 and 19 are diagrams illustrating a semiconductor device according to an example embodiment.
Figure 19:
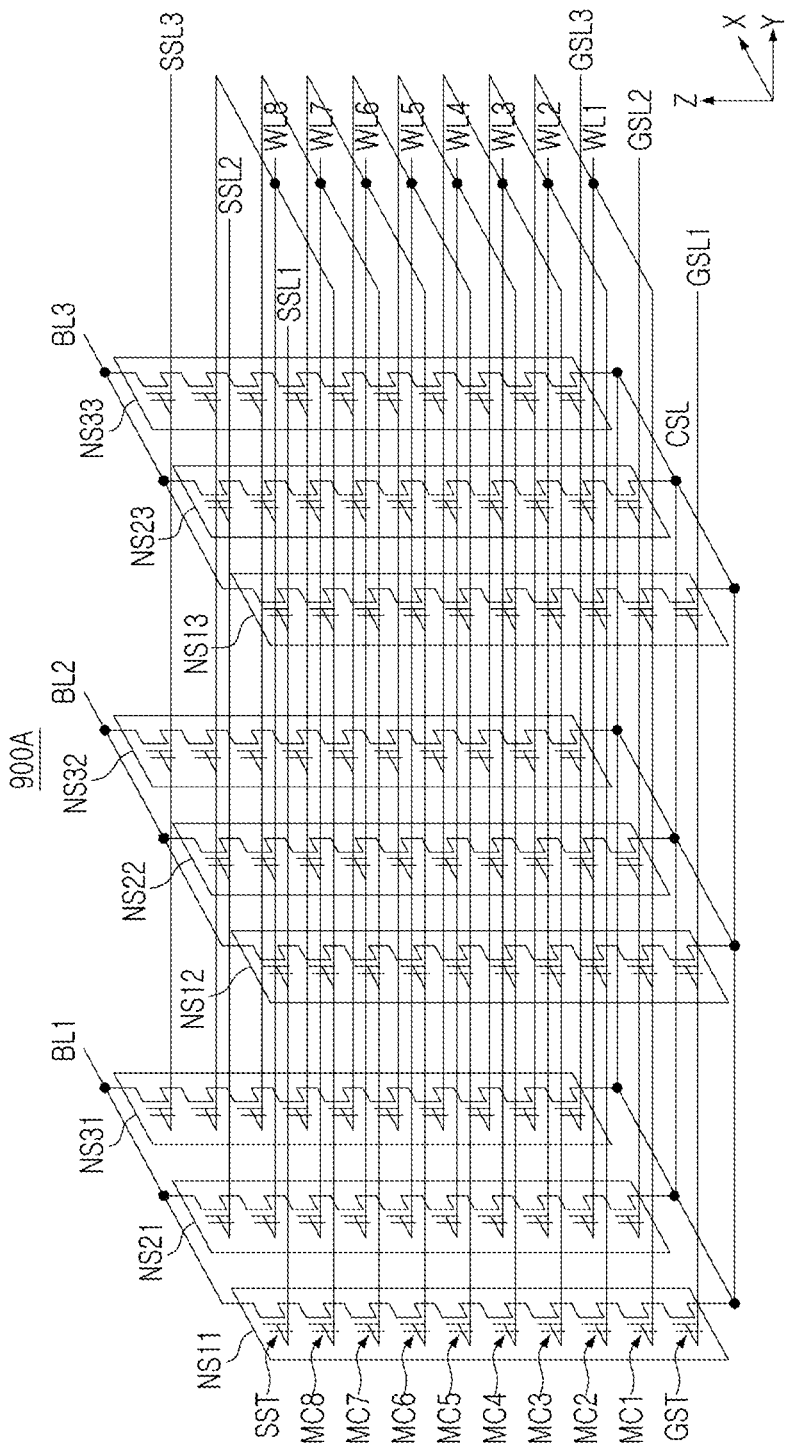

FIGS. 18 and 19 are diagrams illustrating a semiconductor device according to an example embodiment.

In an example embodiment illustrated in FIG. 18, a semiconductor device 900 may be a volatile memory device. The semiconductor device 900 may include a plurality of memory cells MC connected to bit lines BL and word lines WL, and each of the plurality of memory cells MC may include a cell switch TR and a cell capacitor CC. For example, by turning on the cell switch TR and charging or discharging the cell capacitor CC, data may be stored in each of the plurality of memory cells MC, and by turning the cell switch TR on and measuring the voltage of the cell capacitor CC, data stored in each of the plurality of memory cells MC may be read.

On the other hand, in the example embodiment illustrated in FIG. 19, a semiconductor device 900A may be a non-volatile memory device. In the semiconductor device 900A illustrated in FIG. 19, memory cells MC1-MC8 may be formed on a substrate in a three-dimensional structure. For example, a plurality of memory cell strings NS11-NS33 included in the semiconductor device 900A may be formed in a direction perpendicular to the substrate.

Referring to FIG. 19, the semiconductor device 900A may include the plurality of memory cell strings NS11-NS33 connected between the bit lines BL1-BL3 and the common source line CSL. Each of the plurality of memory cell strings NS11-NS33 may include a string select transistor SST, a plurality of memory cells MC1-MC8, and a ground select transistor GST. Although FIG. 19 illustrates that each of the plurality of memory cell strings NS11-NS33 includes eight memory cells MC1-MC8, this may be varied.

The string select transistor SST may be connected to a corresponding string select line SSL1-SSL3. The plurality of memory cells MC1 to MC8 may be respectively connected to corresponding word lines WL1 to WL8. One or more of the word lines WL1-WL8 may be provided as a dummy word line. The ground select transistor GST may be connected to corresponding ground select line GSL1-GSL3. The string select transistor SST may be connected to the corresponding bit line BL1-BL3, and the ground select transistor GST may be connected to the common source line CSL.

Each of the word lines WL1-WL8 may be commonly connected to the plurality of memory cells MC1-MC8 disposed at the same height, and ground selection lines GSL1-GSL3 and string selection lines SSL1-SSL3 may be respectively separated. Although eight word lines WL1-WL8 and three bit lines BL1-BL3 are illustrated in FIG. 19, this may be varied.

The semiconductor devices 900 and 900A according to the example embodiments illustrated in FIGS. 18 and 19 may perform operations of receiving and storing data and outputting the stored data at high speed, and may thus operate in synchronization with a clock signal of a significantly high frequency. As the frequency of the clock signal increases, the eye margin of the signal may decrease due to capacitance of a parasitic component present in the input/output signal and in a signal path connecting the input/output signal and the pads. An inductor circuit providing an inductance capable of reducing an effect due to a capacitance of a parasitic component may be connected to the signal path connecting the input/output signal and the pads. In addition, at least one variable pattern may be included in the inductor circuit to adjust the inductance of the inductor circuit, and whether to input a bias voltage to the variable pattern may be selected. Accordingly, signal integrity may be secured in the semiconductor devices 900 and 900A that input and output signals at high speed.

Figure 20:
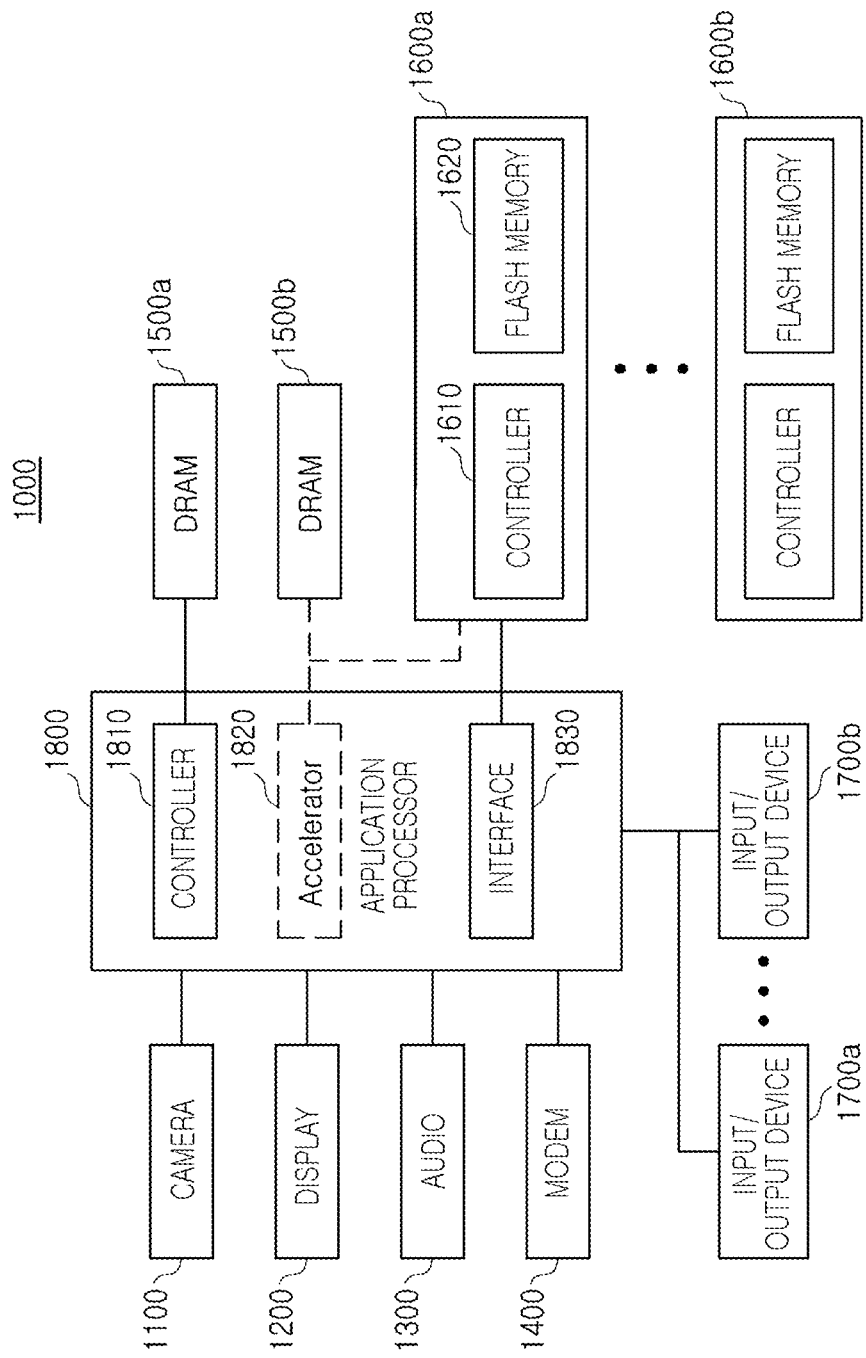
FIG. 20 is a schematic diagram illustrating a system including a semiconductor device according to an example embodiment.

FIG. 20 is a schematic diagram illustrating a system including a semiconductor device according to an example embodiment.

Referring to FIG. 20, a mobile device 1000 may include a camera 1100, a display 1200, an audio processing unit 1300, a modem 1400, DRAMs 1500$a$ and 1500$b$, flash memory devices 1600$a$ and 1600$b$, and input/output devices 1700$a$ and 1700$b$, a sensor device 1800, and an application processor (hereinafter, "AP") 1900.

The mobile device 1000 may be implemented as a laptop computer, a portable terminal, a smartphone, a tablet PC, a wearable device, a healthcare device, or an Internet-of-Things (IoT) device. Also, the mobile device 1000 may be implemented as a server or a personal computer.

Various components included in the mobile device 1000 may operate in synchronization with a predetermined clock. For example, the display 1200 may display a screen according to a predetermined refresh rate, and the DRAMs 1500$a$ and 1500$b$ and the flash memory devices 1600$a$ and 1600$b$ also store and read data at a predetermined speed, or may operate according to a predetermined clock to send and receive the data with other external devices. The input/output devices 1700$a$ and 1700$b$ and the application processor 1900 may also operate according to a predetermined clock.

The camera 1100 may capture a still image or a moving image according to a user's control. The mobile device 1000 may acquire specific information using a still image/video captured by the camera 1100 or convert the still image/video into other types of data such as text or the like and may store the converted data. The camera 1100 may include a plurality of cameras having different angles of view or aperture values. In addition, the camera 1100 may further include a camera that generates a depth image by using depth information of the subject and/or background, in addition to a camera that generates an actual image by photographing the subject.

The display 1200 may also be used as an input device of the mobile device 1000 by providing a touch screen function. In addition, the display 1200 may be provided integrally with a fingerprint sensor and the like to provide a security function of the mobile device 1000. The audio processing unit 1300 may process audio data stored in the flash memory devices 1600$a$ and 1600$b$ or audio data included in contents received externally through the modem 1400 or the input/output devices 1700$a$ and 1700$b$.

The modem 1400 modulates and transmits a signal to transmit/receive wired/wireless data, while demodulating a signal received from the outside to restore an original signal. The input/output devices 1700$a$ and 1700$b$ are devices that provide digital input/output, and may a port that may be connected to an external recording medium, an input device such as a touch screen or a mechanical button key, and an output device capable of outputting vibrations in a haptic manner or the like.

The sensor device 1800 may include a plurality of sensors that collect various information from the outside thereof. The sensor device 1800 may include an illuminance sensor that detects the brightness of light, a gyro-sensor for detecting the movement of the mobile device 1000, a biosensor for obtaining biometric information from a user's body in contact with and/or close to the mobile device 1000, and the like.

The AP 1900 may control the overall operation of the mobile device 1000. In detail, the AP 1900 may control the display 1200 to display a portion of the content stored in the flash memory devices 1600*a* and 1600*b* on the screen. Also, when a user input is received through the input/output devices 1700*a* and 1700*b*, the AP 1900 may perform a control operation corresponding to the user input.

The AP 1900 may include an accelerator block 1920 that is a dedicated circuit for AI data operation. In another implementation, a separate accelerator chip may be provided separately from the AP 1900, and a DRAM 1500*b* may be additionally connected to the accelerator block 1920 or the accelerator chip. The accelerator block 1920 is a function block that professionally performs a specific function of the AP 1900, and may include a Graphics Processing Unit (GPU) that is a functional block that specializes in processing graphics data, a Neural Processing Unit (NPU) that is a block for professionally performing AI calculations and inference, a Data Processing Unit (DPU) that is a block that specializes in data processing, and the like.

According to example embodiments, an inductor circuit as described above may be variously employed in components connected to each other to communicate with each other in the mobile device 1000. For example, according to an example embodiment, the inductor circuit may be applied to a pad for inputting/outputting a signal in at least one of the camera 1100, the display 1200, the audio processing unit 1300, the modem 1400, the DRAMs 1500*a* and 1500*b*, the flash memory devices 1600*a* and 1600*b*, the input/output devices 1700*a* and 1700*b*, the sensor device 1800, and the AP 1900, to improve the eye margin of a signal.

By way of summation and review, a parasitic component may exist in an input/output circuit and between the input/output circuit and a pad. Integrity of a signal that is input/output to the pad may be deteriorated by the parasitic component.

As set forth above, embodiments may provide a semiconductor device in which deterioration of the integrity of signals input/output through a pad may be significantly reduced by connecting an inductor having adjustable inductance to a path connecting an input/output circuit and the pad.

According to example embodiments, by connecting an inductor having adjustable inductance to a path connecting an input/output circuit and a pad, and inductance of the inductor may be set based on the capacitance of a parasitic component present in the path. Therefore, the integrity of the signal input/output through the pad may be secured despite the presence of parasitic components, and performance of a semiconductor device supporting high-speed data communication may be improved.

What is claimed is:

1. A semiconductor device, comprising:
a plurality of pads connected to an external device and each configured to receive a signal from the external device;
a memory cell array including a plurality of memory cells;
a logic circuit configured to control the memory cell array and including an internal circuit and a plurality of input/output circuits connected to the plurality of pads; and
an inductor circuit connected between a first pad of the plurality of pads and a first input/output circuit of the plurality of input/output circuits in series, wherein:
the inductor circuit includes an inductor pattern connected between the first pad and the first input/output circuit, and a variable pattern disposed between at least portions of the inductor pattern,
the variable pattern is separated from the inductor pattern, the first pad, and the first input/output circuit, and
the first input/output circuit connected to the inductor circuit is configured to receive the signal through the inductor circuit and to transmit the signal to the internal circuit.

2. The semiconductor device as claimed in claim 1, wherein:
the logic circuit includes a device region in which a plurality of circuit elements are provided, and an interconnection region in which wiring patterns connected to the plurality of circuit elements are disposed, and
the inductor pattern and the variable pattern are disposed in the interconnection region.

3. The semiconductor device as claimed in claim 2, wherein the inductor pattern is disposed on an uppermost layer of the interconnection region.

4. The semiconductor device as claimed in claim 2, wherein the inductor pattern and the variable pattern are disposed in a redistribution layer extending from an uppermost layer of the interconnection region.

5. The semiconductor device as claimed in claim 1, wherein the variable pattern is disposed at the same height as the inductor pattern.

6. The semiconductor device as claimed in claim 5, wherein the inductor pattern is disposed on two or more different layers, and the variable pattern is disposed on one of the two or more layers.

7. The semiconductor device as claimed in claim 1, wherein the variable pattern is disposed at a height that is different from a height of the inductor pattern.

8. The semiconductor device as claimed in claim 1, wherein:
the variable pattern includes a first variable pattern and a second variable pattern,
the first variable pattern is disposed at a same height as the inductor pattern, and
the second variable pattern is disposed at a height that is different from the inductor pattern.

9. The semiconductor device as claimed in claim 1, wherein the variable pattern is connected to a power wiring that is configured to supply a ground power voltage through at least one switching element.

10. The semiconductor device as claimed in claim 1, wherein a first line and a second line of the inductor pattern are adjacent to both sides of the variable pattern, respectively, and a current flows in the first line and the second line in the same direction.

11. The semiconductor device as claimed in claim 1, wherein a first line and a second line of the inductor pattern are adjacent to both sides of the variable pattern, respectively, and current flows in the first line and the second line in different directions.

12. The semiconductor device as claimed in claim 1, wherein the signal of the first pad is a data signal to be stored in the memory cell array.

13. A semiconductor device, comprising:
a semiconductor substrate;
a plurality of elements disposed on the semiconductor substrate; and
an interconnection region having a plurality of wiring patterns connected to the plurality of elements, the plurality of wiring patterns including an inductor pattern connected to one of a plurality of pads and a variable pattern disposed on a same layer as the inductor pattern, wherein:
the inductor pattern includes a first line and a second line adjacent to both sides of the variable pattern in a first direction, parallel to an upper surface of the semiconductor substrate,
the first line, the second line, and the variable pattern extend in a second direction, intersecting the first direction, and parallel to the upper surface of the semiconductor substrate,
the first line and the second line are connected to each other, and
the variable pattern is disposed between the first line and the second line in the first direction.

14. The semiconductor device as claimed in claim 13, wherein a thickness of the inductor pattern is equal to a greatest thickness among thicknesses of the plurality of wiring patterns.

15. The semiconductor device as claimed in claim 13, wherein the inductor pattern is disposed in a single layer in the interconnection region.

16. The semiconductor device as claimed in claim 13, wherein:
the inductor pattern includes a coil pattern having a spiral shape, a first connection line connected to a first end of the coil pattern, and a second connection line connected to a second end of the coil pattern, and
the first connection line is disposed on a layer that is different from the second connection line.

17. The semiconductor device as claimed in claim 16, wherein:
the variable pattern includes a first variable pattern disposed on the same layer as the first connection line, and a second variable pattern disposed on the same layer as the second connection line, and
a thickness of the first variable pattern is less than a thickness of the second variable pattern.

18. A semiconductor device, comprising:
a plurality of pads connected to an external device and each configured to receive a signal from the external device;
an input/output circuit configured to receive the signal from a first pad of the plurality of pads; and
an inductor circuit connected between the first pad and the input/output circuit in series, wherein:
the inductor circuit includes an inductor pattern connected between the first pad and the input/output circuit, and a variable pattern physically separated from the inductor pattern and adjacent to the inductor pattern, and
the inductor pattern includes a plurality of line patterns connected to each other, in which a first interval between some line patterns adjacent to each other and adjacent to the variable pattern, among the plurality of line patterns, is greater than a second interval between other portions of the line patterns adjacent to each other and not adjacent to the variable pattern.

19. The semiconductor device as claimed in claim 18, wherein a width of the variable pattern is the same as a width of each of the plurality of line patterns.

20. The semiconductor device as claimed in claim 19, wherein the first interval is at least twice the second interval.

* * * * *